US012553939B2

(12) United States Patent
Wang et al.

(10) Patent No.: US 12,553,939 B2
(45) Date of Patent: Feb. 17, 2026

(54) INTERCONNECT STRUCTURES IN INTEGRATED CIRCUIT CHIPS

(71) Applicant: Taiwan Semiconductor Manufacturing Company, Ltd., Hsinchu (TW)

(72) Inventors: Meng-Han Wang, Hsinchu (TW); Yu-Ting Lin, Hsin-Chu (TW); Chia Hong Lin, Hsinchu County (TW); Kao Chih Liu, Changhua County (TW); Wei-Cheng Liu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 659 days.

(21) Appl. No.: 17/832,488

(22) Filed: Jun. 3, 2022

(65) Prior Publication Data

US 2023/0160953 A1     May 25, 2023

Related U.S. Application Data

(60) Provisional application No. 63/303,297, filed on Jan. 26, 2022, provisional application No. 63/281,374, filed on Nov. 19, 2021.

(51) Int. Cl.
  G01R 31/28        (2006.01)
  H01L 21/768       (2006.01)
  (Continued)

(52) U.S. Cl.
  CPC .... *G01R 31/2884* (2013.01); *H01L 21/76898* (2013.01); *H01L 23/5283* (2013.01);
  (Continued)

(58) Field of Classification Search
  None
  See application file for complete search history.

(56) References Cited

U.S. PATENT DOCUMENTS 6,576,923 B2 *  6/2003  Satya ................... H01L 23/544
                                                        977/890
9,716,048 B2 *  7/2017  Kim ....................... H01L 22/32
(Continued)

FOREIGN PATENT DOCUMENTS

JP     2009027053 A     2/2009
KR   1020200032470 A    3/2020
(Continued)

OTHER PUBLICATIONS

Deutsches Patent-und Markenamt, German Office Action, Nov. 12, 2025, pp. 1-4.

*Primary Examiner* — Long Pham
(74) *Attorney, Agent, or Firm* — Sterne, Kessler, Goldstein & Fox P.L.L.C.

(57) ABSTRACT

An integrated circuit (IC) chip package and a method of fabricating the same are disclosed. The IC chip package includes a device layer on a first surface of a substrate, a first interconnect structure on the device layer, and a second interconnect structure on the second surface of the substrate. The first interconnect structure includes a fault detection line in a first metal line layer and configured to emit an electrical or an optical signal that is indicative of a presence or an absence of a defect in the device layer, a metal-free region on the fault detection line, and a metal line adjacent to the fault detection line in the first metal line layer. The fault detection line is electrically connected to the device layer.

20 Claims, 18 Drawing Sheets

(51) Int. Cl.
*H01L 23/528* (2006.01)
*H01L 23/48* (2006.01)
*H10D 84/83* (2025.01)

(52) U.S. Cl.
CPC ............ *H01L 23/481* (2013.01); *H10D 84/83* (2025.01); *H10D 84/834* (2025.01)

(56) References Cited

U.S. PATENT DOCUMENTS

| | | |
|---|---|---|
| 9,985,006 B2 | 5/2018 | Jeng et al. |
| 11,121,046 B2 * | 9/2021 | Lee .................... G01R 31/2856 |
| 2007/0048884 A1 | 3/2007 | Nagel |
| 2010/0096718 A1 | 4/2010 | Hynecek et al. |
| 2016/0284829 A1 | 9/2016 | Klowak et al. |
| 2017/0345804 A1 * | 11/2017 | Jeng .................... H01L 21/4857 |
| 2018/0233440 A1 | 8/2018 | Law et al. |
| 2019/0114097 A1 | 4/2019 | Tran et al. |
| 2020/0091021 A1 | 3/2020 | Lee et al. |
| 2020/0371972 A1 | 11/2020 | Fayneh et al. |
| 2021/0134643 A1 | 5/2021 | Or-Bach et al. |
| 2022/0359326 A1 | 11/2022 | Yu et al. |

FOREIGN PATENT DOCUMENTS

| | | |
|---|---|---|
| TW | 201545247 A | 12/2015 |
| TW | 201743422 A | 12/2017 |
| TW | 201937692 A | 9/2019 |
| TW | 202008485 A | 2/2020 |
| TW | 202013658 A | 4/2020 |
| TW | 202044516 A | 12/2020 |

* cited by examiner

INTERCONNECT STRUCTURES IN INTEGRATED CIRCUIT CHIPS

CROSS-REFERENCE TO RELATED APPLICATIONS

This application claims the benefit of U.S. Provisional Patent Application No. 63/281,374, titled "Interconnect Structures," filed on Nov. 19, 2021, and U.S. Provisional Patent Application No. 63/303,297, titled "Metal Routing for Global Fault Isolation," filed on Jan. 26, 2022, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around (GAA) FETs in integrated circuit (IC) chips. Such scaling down has increased the complexity of manufacturing the IC chips and the complexity of fault detection in the manufactured IC chips.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
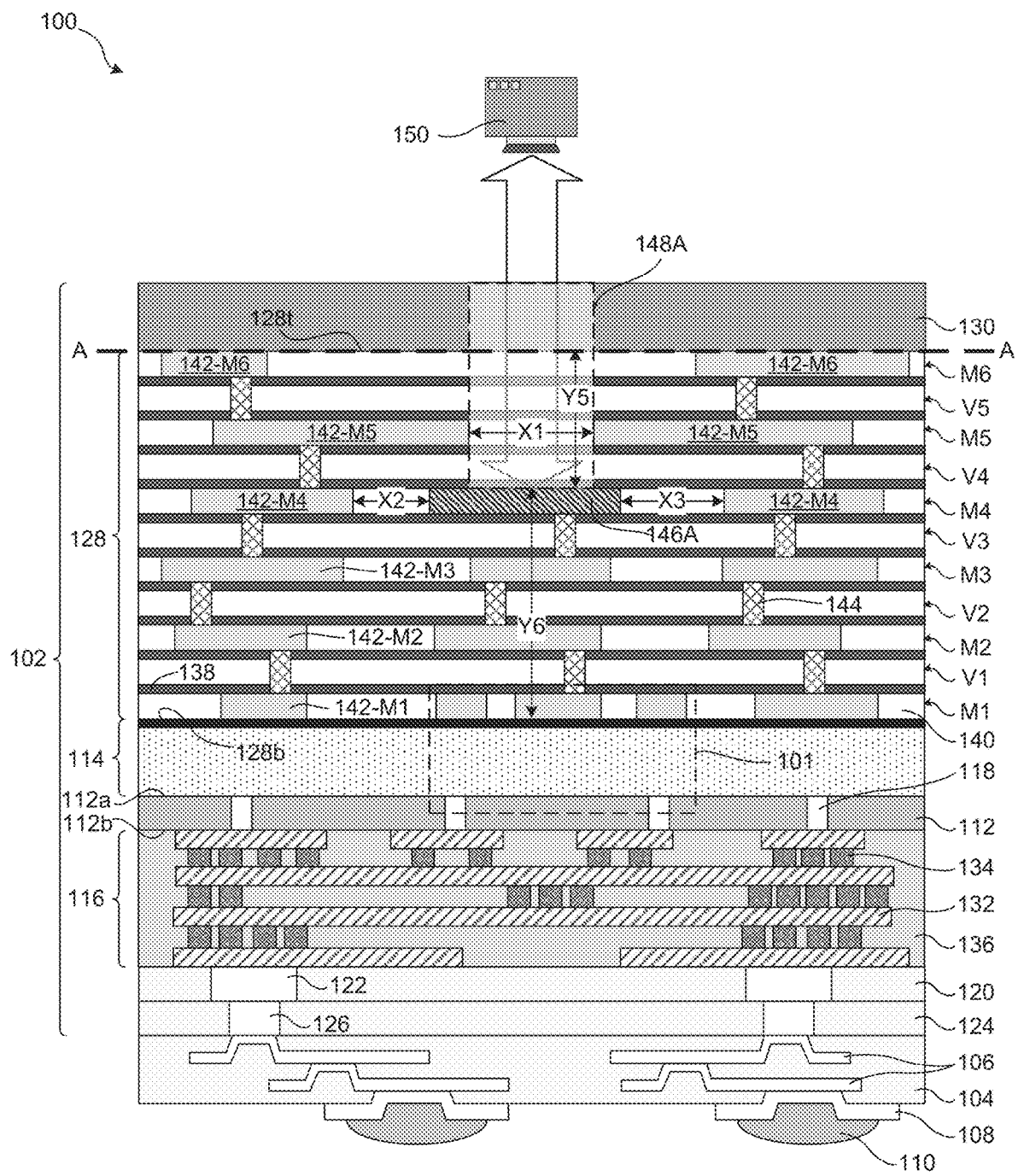
FIG. 1A-1G illustrate cross-sectional and top-down views of an IC chip package with a fault detection line, in accordance with some embodiments.
Figure 1A:
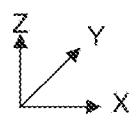

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

An IC chip can include a compilation of layers with different functionality, such as interconnect structures, power distribution network, logic chips, memory chips, radio frequency (RF) chips, and the like. The IC chip is subject to variations in the manufacturing process that can result in latent fabrication defects in the electrical components of the IC chip. When fabrication conditions in the processing chamber deviate from the ideal conditions, abnormalities can be introduced in the physical structure of the electrical components that manifest as faults in the operation of the IC chip. A fault detection system can be used to detect the faults and provide real-time results on manufacturing yield or operation status of semiconductor devices in the IC chip.

An example fault detection system can include a detector or a sensor configured to detect signals generated by terminals (e.g., metal output nodes, source contact structures, and/or drain contact structures) of semiconductor devices in a device layer of the IC chip. The signals can propagate through dielectric layers (e.g., interlayer dielectric (ILD) layers) in front-side or back-side interconnect structures (e.g., back-side power grid lines) and semiconductor materials (e.g., a semiconductor substrate) on the device layer and emit from the front-side or back-side of the IC chip. The detector can be placed at the front-side or back-side of the IC chip and configured to capture and analyze the emitted signal. The fault detection system can identify one or more malfunctioning standard cells of the IC chip based on the analyzed signal.

Though the signals emitted by the terminals of the semiconductor devices can propagate through the dielectric and semiconductor materials in the IC chip, the signals can be blocked or hampered by metal elements (e.g., metal lines or metal vias) in the front-side and back-side interconnect structures on the front-side and back-side of the IC chip, impacting real-time fault detection in the IC chip. To prevent signal blockage by the metal elements in the front-side or back-side interconnect structures, metal-free regions aligned with the terminals of the semiconductor devices can be formed in the front-side or back-side interconnect structures, respectively. However, the continuing trend of scaling down devices and increasing the density of devices in the IC chip increases the challenges and complexities of fabricating the front-side and back-side interconnect structures with metal-free regions aligned with the terminals of the semiconductor devices for fault detection.

The present disclosure provides example structures of IC chips with fault detection lines in front-side interconnect structures of the IC chips and example methods of fabricating the same to reduce the volume area of metal-free regions in the front-side interconnect structures. In some embodiments, the fault detection lines can be metal lines in the front-side interconnect structure and can be electrically connected to the terminals of the semiconductor devices (e.g., GAA FETs, finFETs, or MOSFETs) in the IC chip through other metal lines and vias in the front-side interconnect structure. The signals emitted by the fault detection lines represent the signals emitted by the terminals of the semiconductor devices and are detected by the fault detection system for monitoring faults in the semiconductor devices. By extending the points of fault detection from the terminals of the semiconductor devices in the device layer to the fault detection lines in the front-side interconnect structure on the device layer, the signal propagation path through the IC chip to the fault detection system is reduced. As a result of the short signal propagation path in the front-side interconnect structure, the volume area for metal-free regions in the front-side interconnect structure can also be reduced.

Figure 1B:
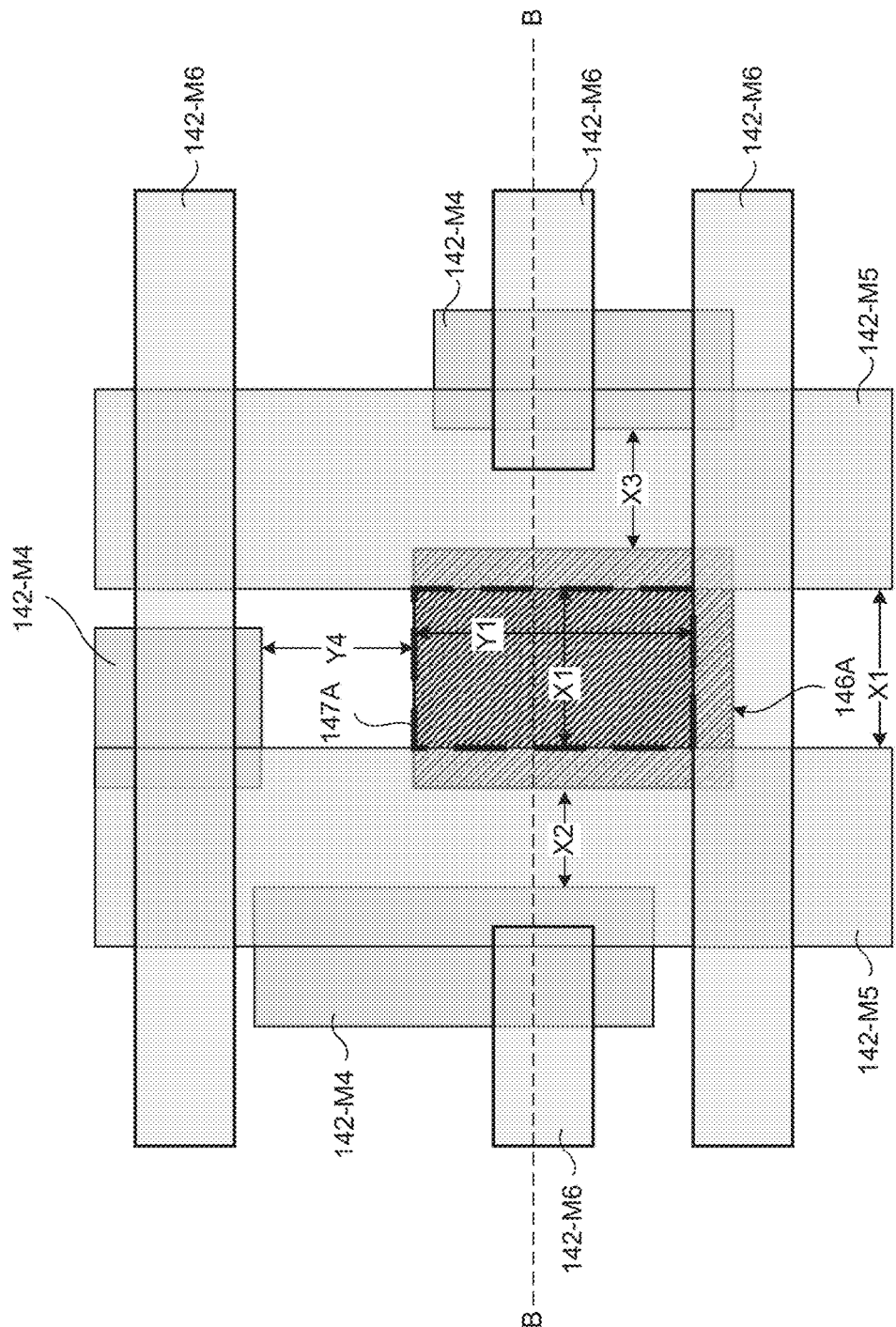
Figure 1C:
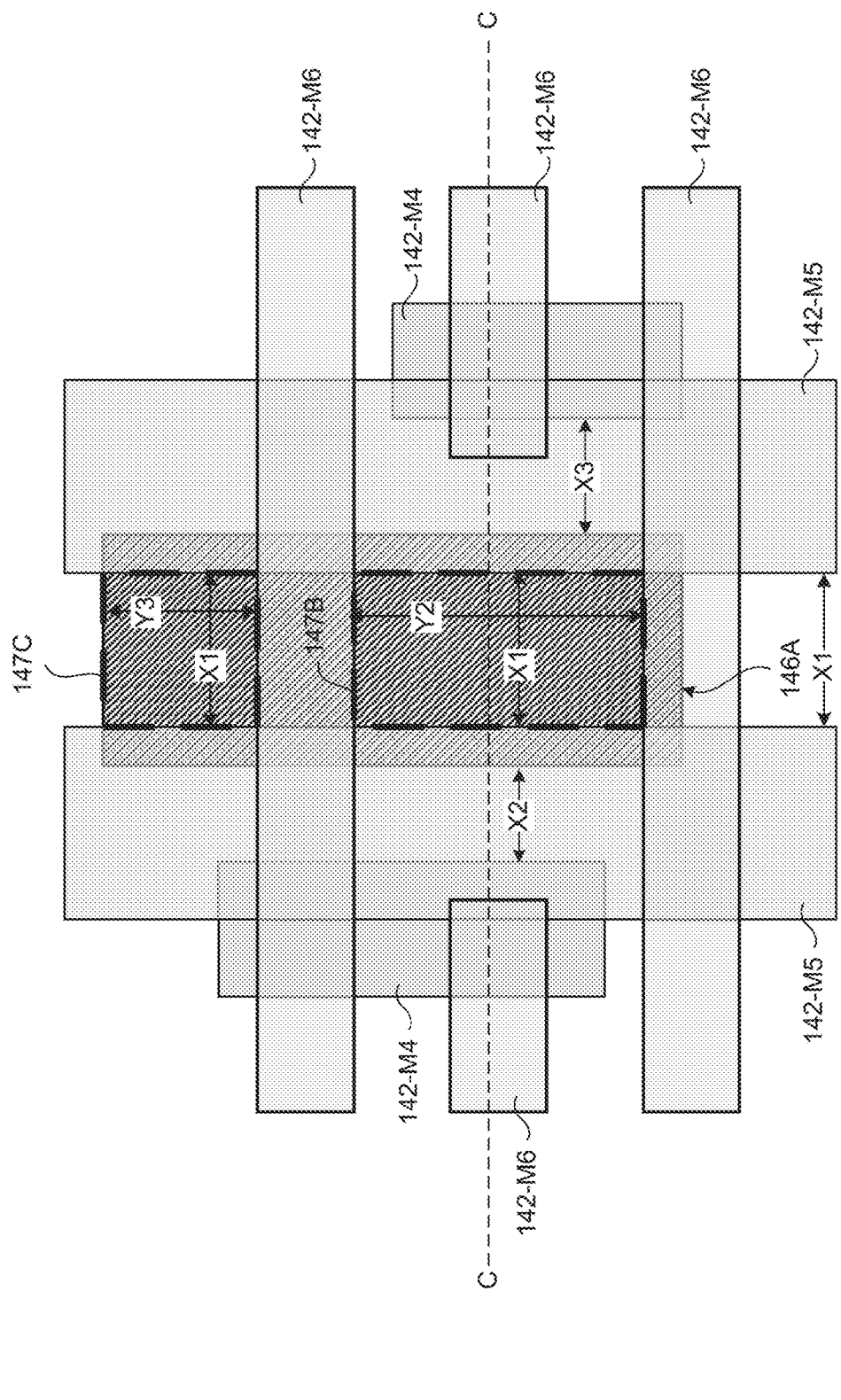
Figure 1D:
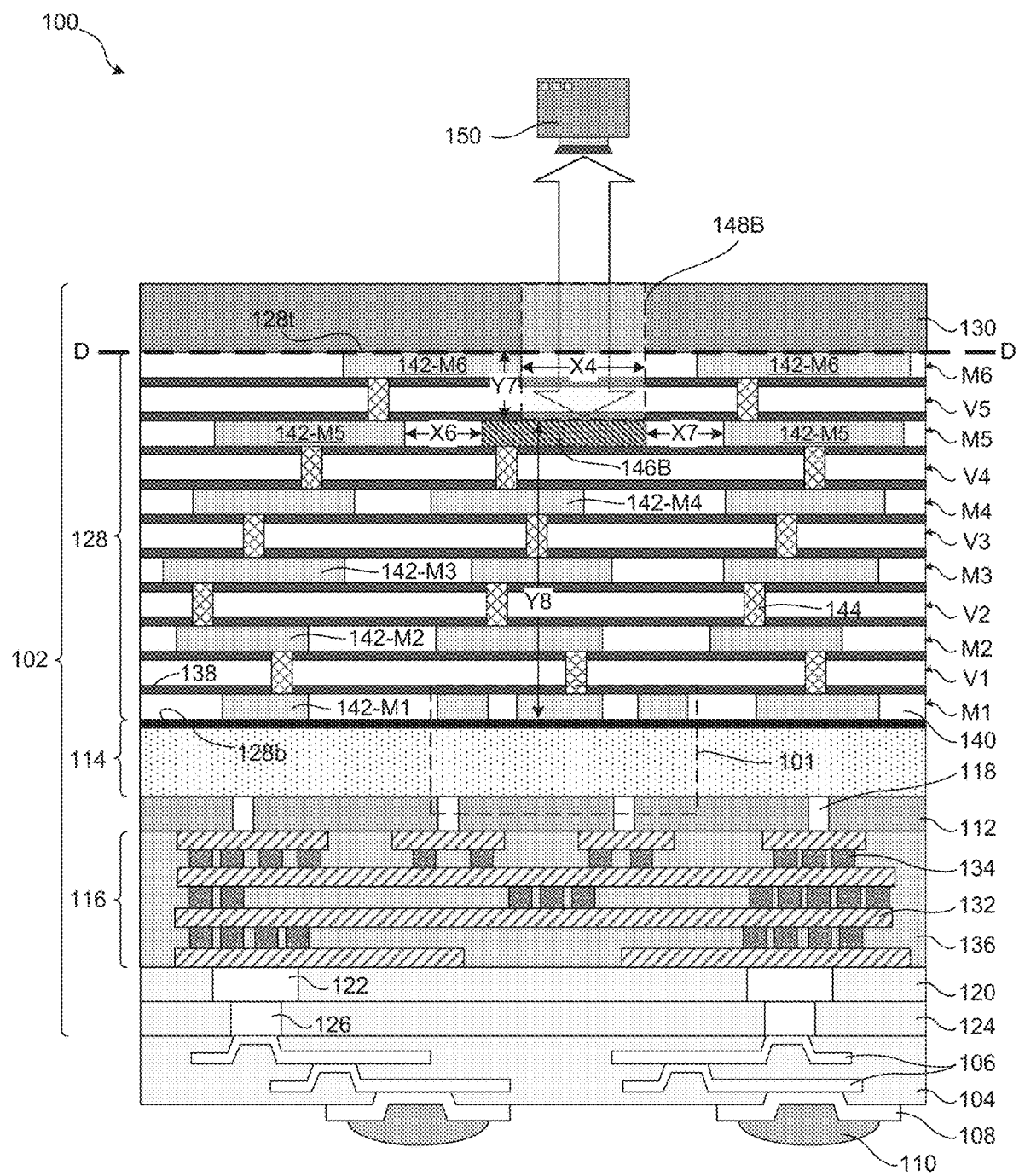
Figure 1E:
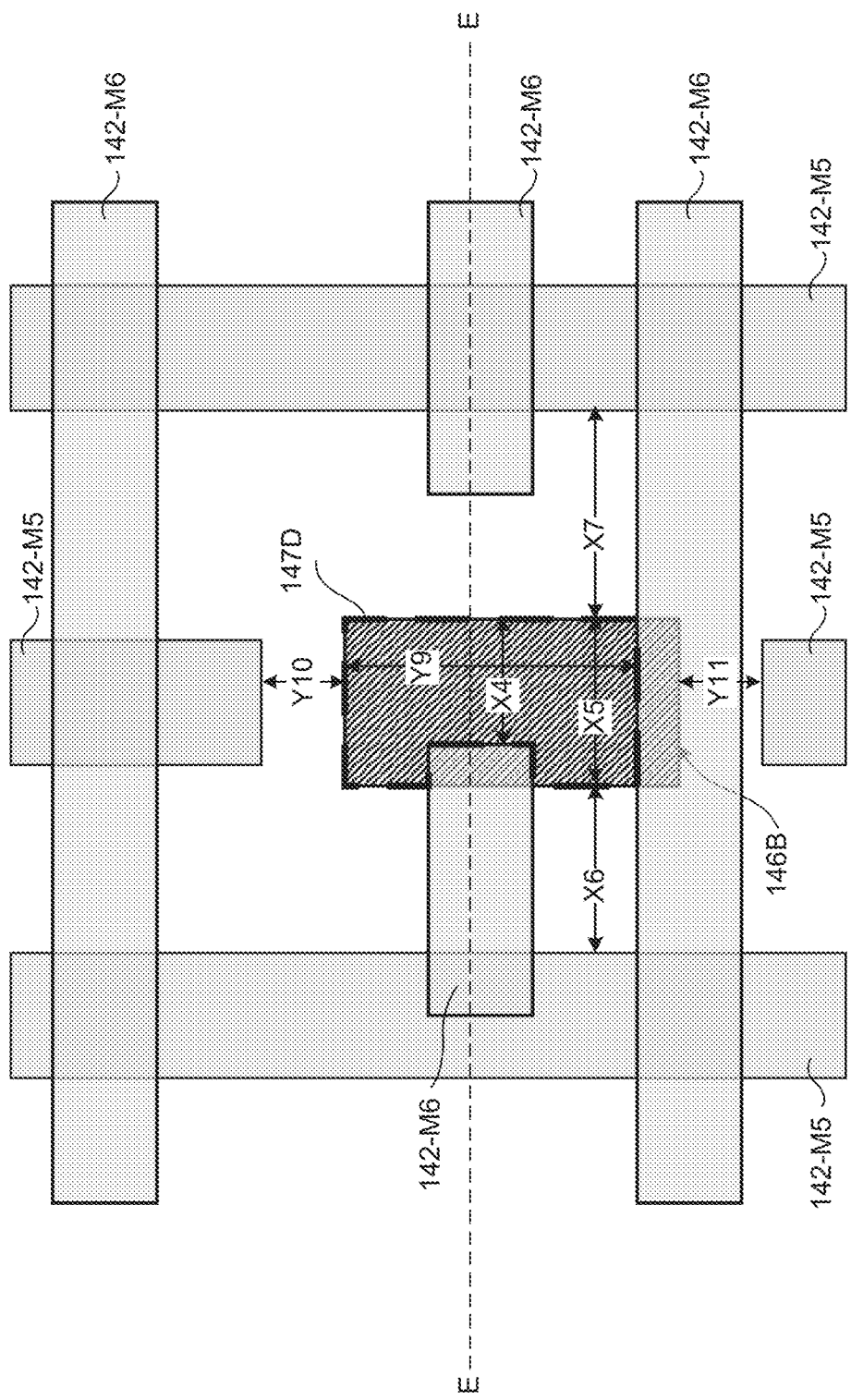
Figure 1F:
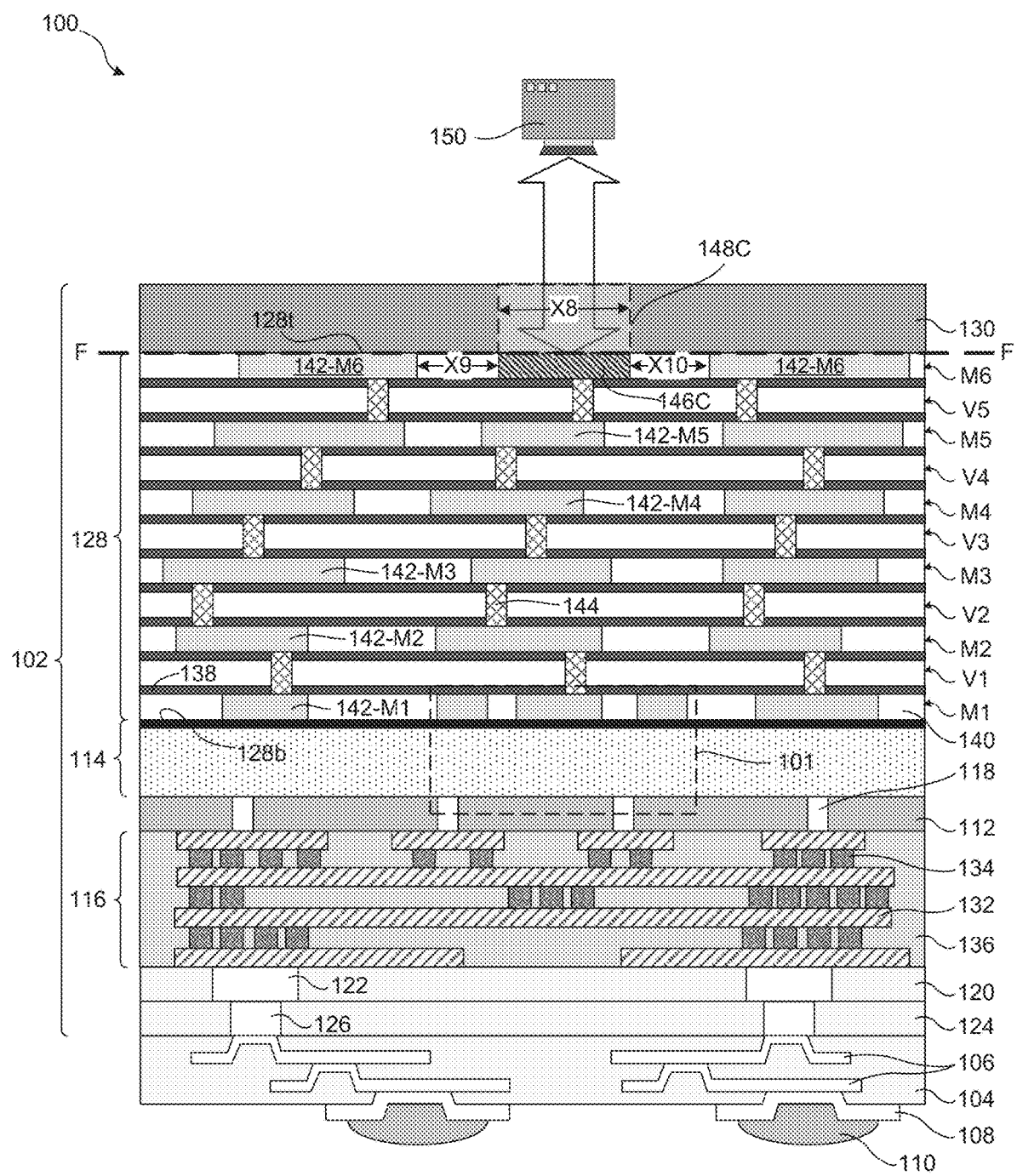

FIGS. 1A, 1D, and 1F illustrate different cross-sectional views of an IC chip package 100, according to some embodiments. In some embodiments, IC chip package 100 can have an integrated fan-out (InFO) package structure. In some embodiments, IC chip package 100 can include (i) an IC chip 102, (ii) a dielectric layer 104 disposed on a back-side surface of IC chip 102, (iii) redistribution layers (RDLs) 106 disposed in dielectric layer 104, (iv) metal contact pads 108 disposed on dielectric layer 104 and in electrical contact with RDLs 106, and (v) solder balls 110 disposed on metal contact pads 108. In some embodiments, IC chip package 100 can include other elements, such as molding layer surrounding IC chip 102 and conductive through-vias disposed in the molding layer and adjacent to IC chip 102, which are not shown for simplicity.

In some embodiments, RDLs 106 can be electrically connected to semiconductor devices of device layer 114 (discussed below) of IC chip 102. RDLs 106 can be configured to fan out IC chip 102 such that I/O connections (not shown) on IC chip 102 can be redistributed to a greater area than IC chip 102, and consequently increase the number of I/O connections of IC chip 102. In some embodiments, solder balls 110 can be electrically connected to RDLs 106 through metal contact pads 108. In some embodiments, solder balls 110 can electrically connect IC chip package 100 to a printed circuit board (PCB).

In some embodiments, RDLs 106 and metal contact pads 108 can include a material similar to or different from each other. In some embodiments, RDLs 106 and metal contact pads 108 can include a metal (such as copper and aluminum), a metal alloy (such as copper alloy and aluminum alloy), or a combination thereof. In some embodiments, RDLs 106 and metal contact pads 108 can include a titanium liner and a copper fill. The titanium liner can be disposed on bottom surfaces and sidewalls of RDLs 106 and metal contact pads 108. In some embodiments, dielectric layer 104 can include a stack of dielectric layers.

Figure 1G:
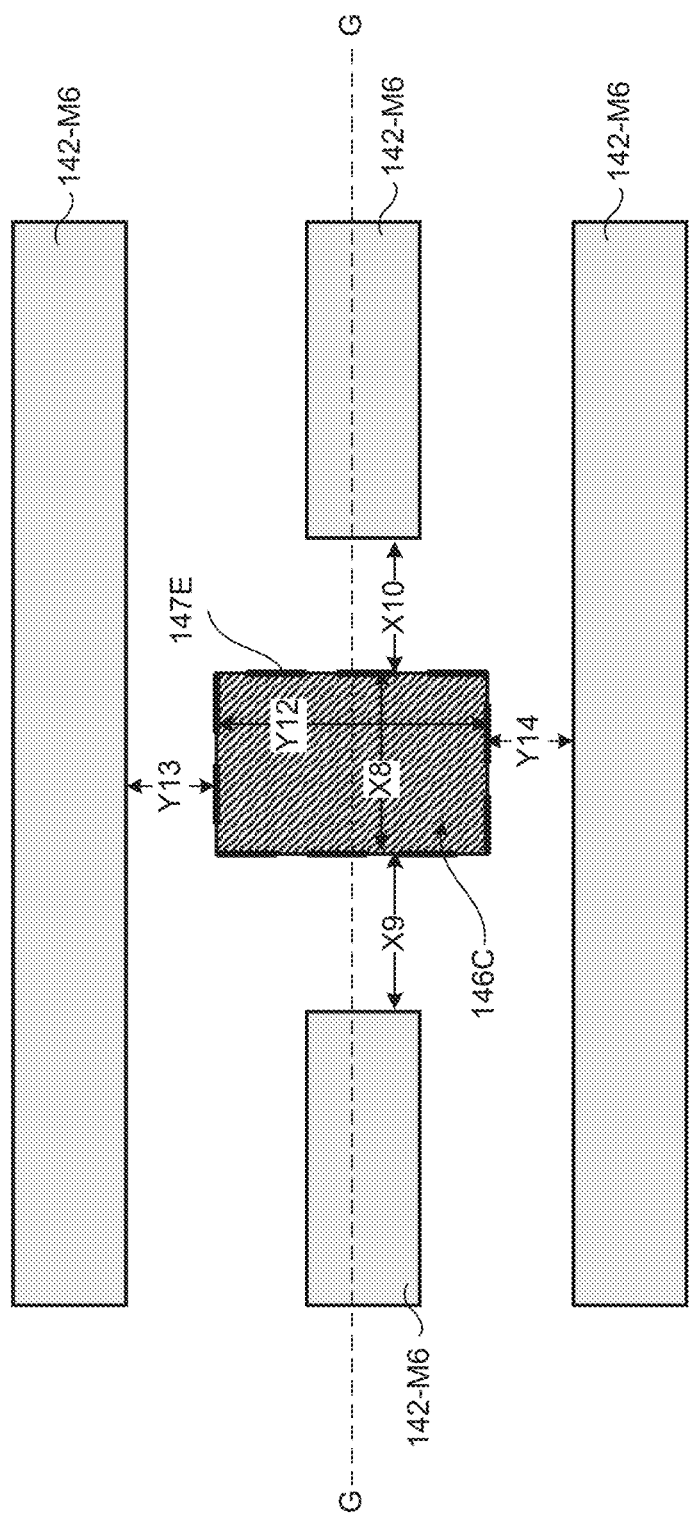
Figure 1H:
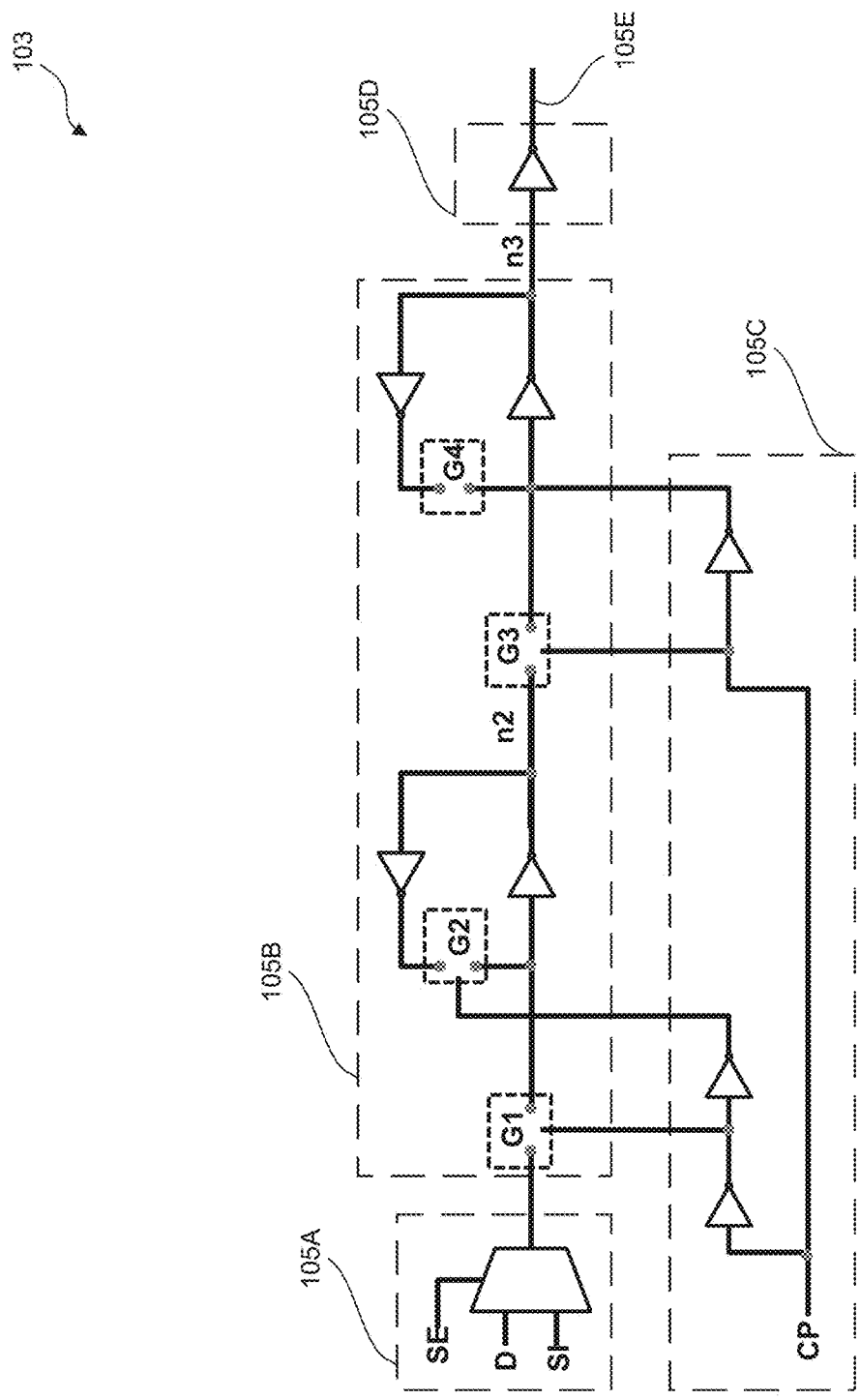
FIG. 1H illustrates a standard cell circuit in an IC chip package, in accordance with some embodiments.
Figure 2A:
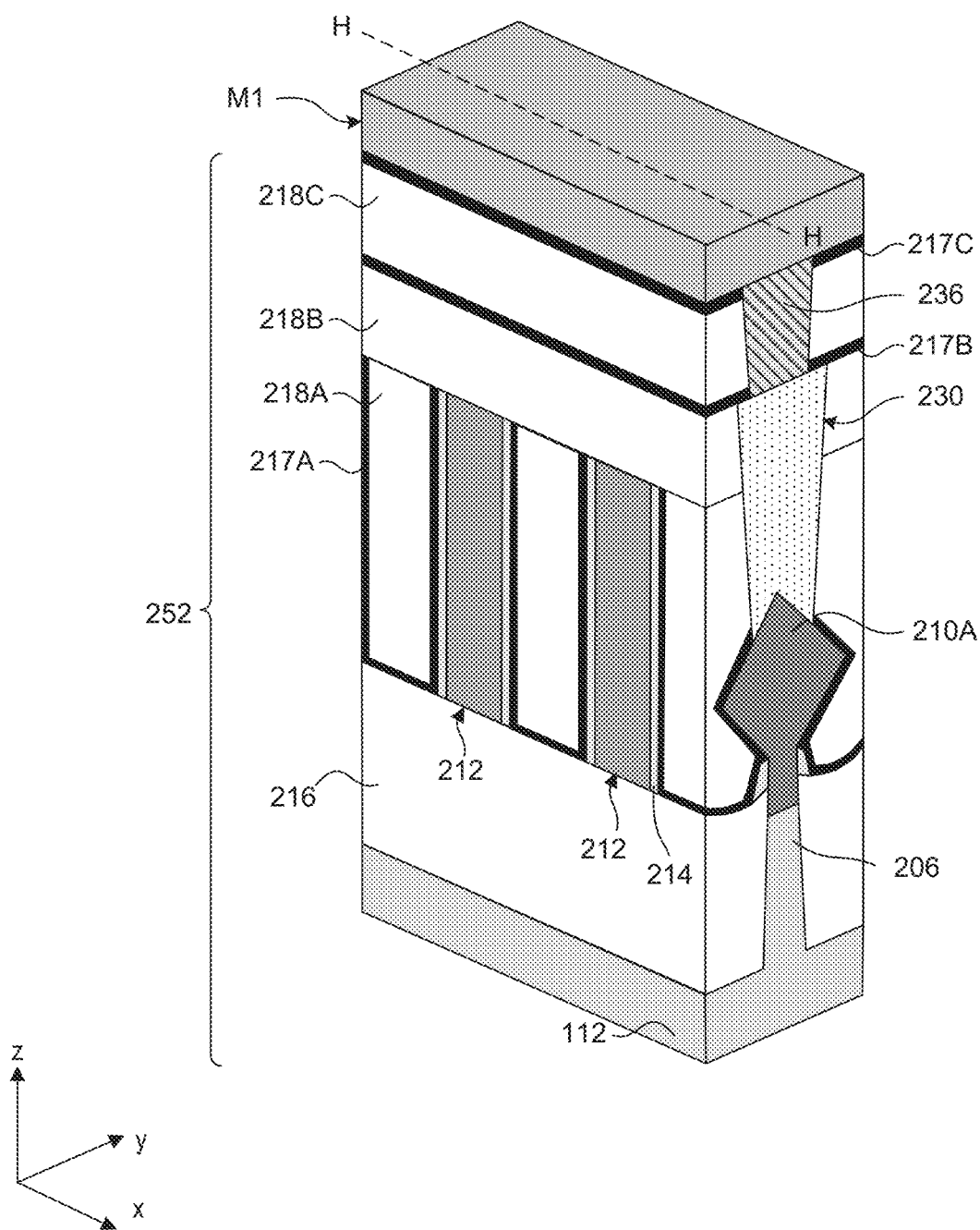
FIGS. 2A-2C illustrate isometric and cross-sectional views of a device layer in an IC chip package, in accordance with some embodiments.
Figure 2B:
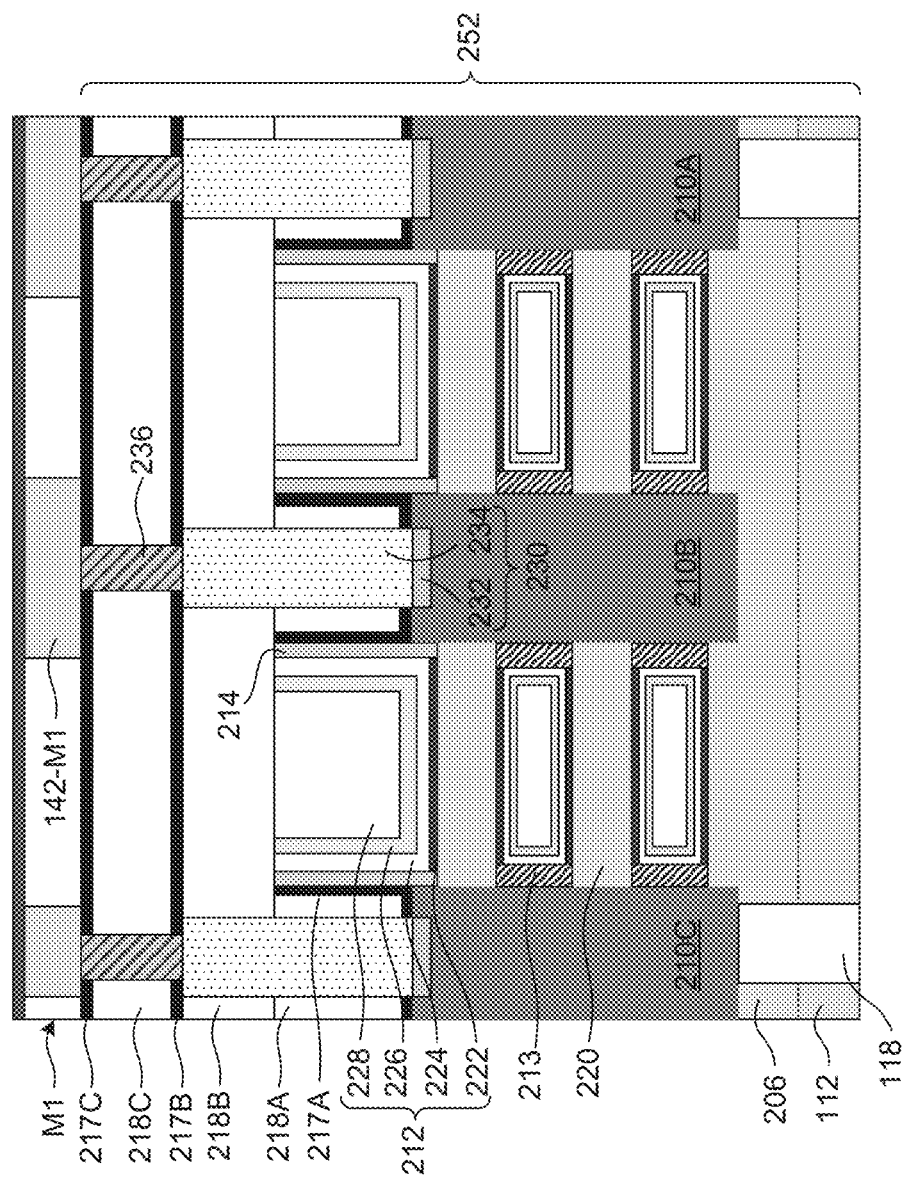
Figure 2C:
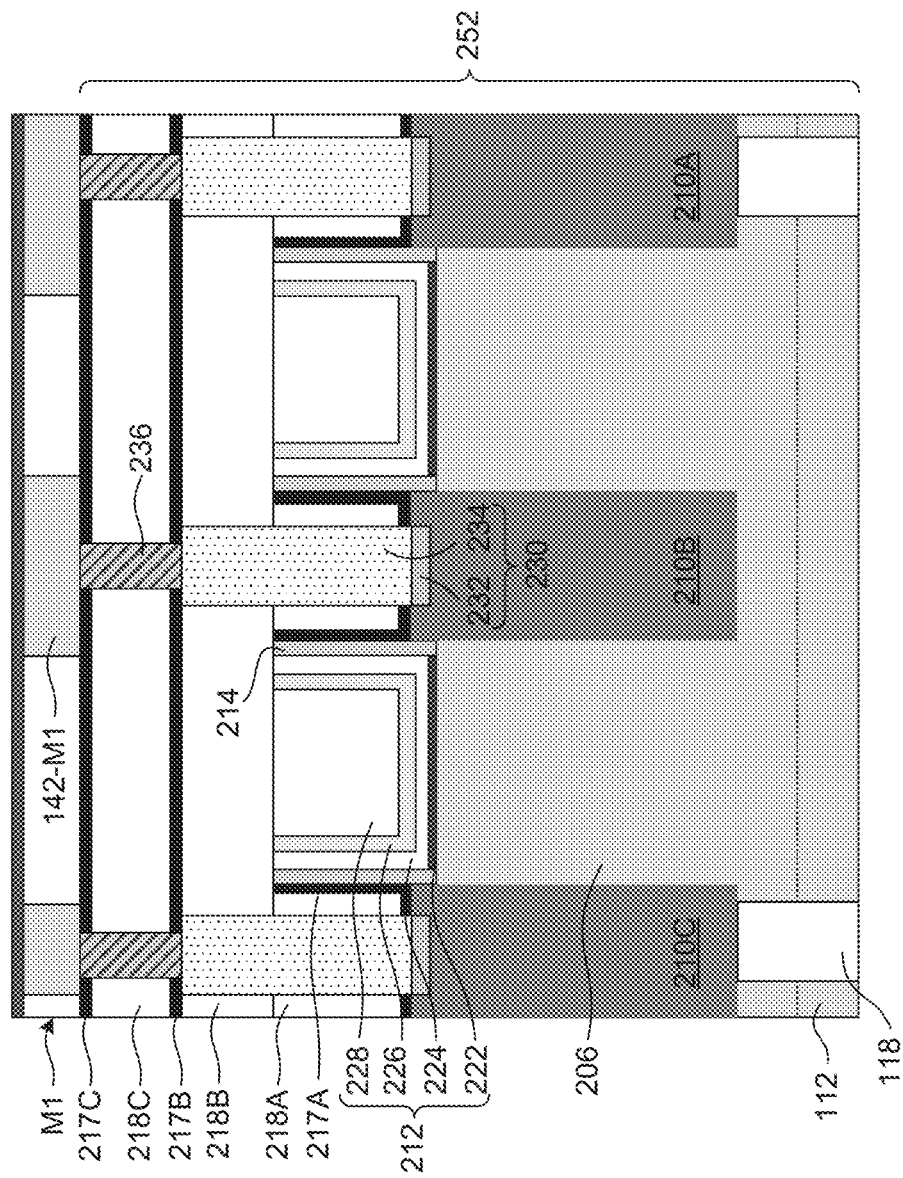

IC chip 102 is described with reference to FIGS. 1A-1H and 2A-2C. FIGS. 1A, 1D, and 1F illustrate cross-sectional views of IC chip 102 along an XZ-plane. In some embodiments, IC chip 102 can have different cross-sectional views of FIGS. 1A, 1D, and 1F at different XZ-planes of IC chip 102 or at different regions of the same XZ-plane of IC chip 102. In some embodiments, IC chip 102 can have any two of the three different cross-sectional views of FIGS. 1A, 1D, and 1F at different XZ-planes of IC chip 102 or at different regions of the same XZ-plane of IC chip 102. In some embodiments, IC chip 102 can have any one of the three different cross-sectional views of FIGS. 1A, 1D, and 1F at different XZ-planes of IC chip 102 or at different regions of the same XZ-plane of IC chip 102. FIGS. 1B-1C illustrate different top-down views of IC chip 102 along line A-A of FIG. 1A and along an XY-plane, according to some embodiments. FIG. 1E illustrates a top-down view of IC chip 102 along line D-D of FIG. 1D and along an XY-plane, according to some embodiments. FIG. 1G illustrates a top-down view of IC chip 102 along line F-F of FIG. 1F and along an XY-plane, according to some embodiments. FIG. 1H illustrates a standard cell circuit 103 in IC chip 102, according to some embodiments. FIGS. 2A-2C illustrate enlarged views of region 101 of FIGS. 1A, 1D, and 1F according to some embodiments. FIG. 2A illustrates an isometric view of the structures in region 101, according to some embodiments. FIGS. 2B-2C illustrate different cross-sectional views along line H-H of FIG. 2A with additional structures that are not shown in FIG. 2A for simplicity, according to some embodiments. The discussion of elements in FIGS. 1A-1H and 2A-2C with the same annotations applies to each other, unless mentioned otherwise.

In some embodiments, IC chip 102 can include (i) a substrate 112 with a front-side surface 112a and a back-side surface 112b, (ii) a device layer 114 disposed on front-side surface 112a of substrate 112, (iii) a back-side interconnect structure 116 disposed on back-side surface 112b of substrate 112, (iv) conductive through-vias 118 disposed within substrate 112, (v) a passivation layer 120 disposed on a back-side surface of back-side interconnect structure 116, (vi) conductive pads 122 disposed within passivation layer 120 and on back-side surface of back-side interconnect structure 116, (vii) a stress buffer layer 124 disposed on passivation layer 120 and conductive pads 122, (viii) conductive vias 126 disposed within stress buffer layer 124 and on conductive pads 122, (ix) a front-side interconnect structure 128 disposed on device layer 114, and (x) a substrate 130 disposed on front-side interconnect structure 128.

In some embodiments, substrates 112 and 130 can be a semiconductor material, such as silicon, germanium (Ge), silicon germanium (SiGe), a silicon-on-insulator (SOI) structure, other suitable semiconductor materials, and a combination thereof. Further, substrate 112 can be doped with p-type dopants (e.g., boron, indium, aluminum, or gallium) or n-type dopants (e.g., phosphorus or arsenic).

In some embodiments, device layer 114 can include semiconductor devices, such as GAA FETs (e.g., GAA FET 252 shown in FIG. 2B), finFETs (e.g., finFET 252 shown in FIG. 2C), and MOSFETs. The semiconductor devices can be electrically connected to back-side interconnect structure 116 through conductive through-vias 118 and can be can be electrically connected to RDLs 106 through back-side interconnect structure 116, conductive pads 122, and conductive vias 126. In some embodiments, the semiconductor devices in device layer 114 can form a standard cell circuit 103 as shown in FIG. 1H. In some embodiments, standard cell circuit 103 can include a logic circuit with an input circuit 105A (e.g., a multiplexer circuit), a flip flop circuit 105B, a clock circuit 105C, an output circuit 105D, and an output terminal 105E. In some embodiments, output terminal 105E can be a source/drain contact structure of a semiconductor device (e.g., source/drain contact structure 230 shown in FIGS. 2B-2C). In some embodiments, the output of standard cell circuit 103 can be measured from output terminal 105E. In some embodiments, the operation status and/or manufacturing yield of the semiconductor devices in standard cell circuit 103 can be determined and monitored by a fault detection system based on the signals from output terminal 105E, as described in detail below. In some embodiments, another standard cell circuit in device layer 114 can be electrically connected in a chain connection to standard cell circuit 103. That is, an output terminal of the other standard cell circuit can be electrically connected to input circuit 105A of standard cell circuit 103, and the signals from output terminal 105E can be used to provide the operation status and/or manufacturing yield of the semiconductor devices in standard cell circuit 103 and the other standard cell circuit. In some embodiments, the other standard cell circuit can be similar to or different from standard cell circuit 103. In some embodiments, more than one standard cell circuits in device layer 114 can be electrically connected in a chain connection to standard cell circuit 103 to monitor the operation status and/or manufacturing yield of the semiconductor devices in device layer 114 based on the signals from output terminal 105E.

In some embodiments, back-side interconnect structure 116 can be a power distribution network disposed on back-side surface 112b of substrate 112 to improve device density and manufacturing flexibility of IC chip 102. Back-side interconnect structure 116 can be electrically connected to back-sides of the semiconductor devices (e.g., back-sides of source/drain regions and/or back-sides of gate structures) in device layer 114 through conductive through-vias 118 and/or other suitable conductive structures to supply power to the semiconductor devices. Back-side interconnect structure 116 can include power grid (PG) wires, such as conductive lines 132 embedded in a back-side dielectric layer 136. Back-side interconnect structure 116 can further include conductive vias 134 embedded in a back-side dielectric layer 136 to provide electrical connections between the PG wires. In some embodiments, conductive lines 132 can be electrically connected to $V_{SS}$ (e.g., ground voltage reference) and/or $V_{DD}$ (e.g., power supply voltage reference) of power supply lines. In some embodiments, conductive lines 132 and conductive vias 134 can include conductive materials, such as copper, aluminum, cobalt, tungsten, metal silicides, highly-conductive tantalum nitride, other suitable conductive materials, or combinations thereof. In some embodiments, back-side dielectric layer 136 can include dielectric materials, such as silicon oxide, undoped silica glass, fluorinated silica glass, and other suitable materials. In some embodiments, back-side dielectric layer 136 can include a low-k dielectric material (e.g., material with a dielectric constant less than 3.9).

In some embodiments, passivation layer 120 can include an oxide layer and a nitride layer. The oxide layer can include silicon oxide ($SiO_2$) or another suitable oxide-based dielectric material and nitride layer can include silicon nitride (SiN) or another suitable nitride-based dielectric material that can provide moisture control to IC chip 102 during the packaging of IC chip 102. In some embodiments, conductive pads 122 can include aluminum.

In some embodiments, stress buffer layer 124 disposed on passivation layer 120 can mitigate the mechanical and/or thermal stress induced during packaging of IC chip 102, such as during the formation of RDLs 106 and/or during the formation of solder balls 110. In some embodiments, stress buffer layer 124 can include a dielectric material, such a low-k dielectric material with a dielectric constant (k) less than about 3.5, an undoped silicate glass (USG), and a fluorinated silica glass (FSG). In some embodiments, stress buffer layer 124 can include a polymeric material, such as polyimide, polybenzoxazole (PBO), an epoxy-based polymer, a phenol-based polymer, and benzocyclobutene (BCB).

In some embodiments, conductive vias 126 disposed within stress buffer layer 124 can be electrically connect back-side interconnect structure 116 to RDLs 106. In some embodiments, conductive vias 126 can include (i) a conductive material, such as copper (Cu), aluminum (Al), tungsten (W), titanium (Ti), tantalum (Ta), titanium nitride (TiN), tantalum nitride (TaN), titanium aluminum (TiAl), titanium aluminum nitride (TiAlN), and tungsten nitride (WN); (ii) a metal alloy, such as copper alloys and aluminum alloys; and (iii) a combination thereof. In some embodiments conductive vias 126 can include a titanium (Ti) liner and a copper (Cu) fill. The titanium liner can be disposed on bottom surfaces and sidewalls of conductive vias 126.

In some embodiments, front-side interconnect structure 128 can be disposed on device layer 114. Front-side interconnect structure 128 can have a top-side surface 128t in physical contact with substrate 130 and a bottom-side surface 128b in physical contact with device layer 114. In some embodiments, front-side interconnect structure 128 can include metal line layers M1-M6 and via layers V1-V5 providing electrical connection between metal line layers M1-M6. Though six metal line layers M1-M6 and five via layers V1-V5 are discussed with reference to FIGS. 1A, 1D, and 1F, interconnect structure 128 can have any number of metal line layers M1-M6 and via layers V1-V5. In some embodiments, front-side interconnect structure 128 can further include etch stop layers (ESLs) 138 and ILD layers 140. In some embodiments, ESLs 138 can include a dielectric material, such as aluminum oxide ($Al_xO_y$) nitrogen doped silicon carbide (SiCN), and oxygen doped silicon carbide (SiCO) with a dielectric constant ranging from about 4 to about 10.

In some embodiments, ILD layers 140 can include a low-k (LK) or extra low-k (ELK) dielectric material with a dielectric constant lower than that of silicon oxide (e.g., dielectric constant between about 2 and about 3.7). In some embodiments, the LK or ELK dielectric material can include silicon oxycarbide (SiOC), nitrogen doped silicon carbide (SiCN), silicon oxycarbon nitride (SiCON), or oxygen doped silicon carbide. In some embodiments, ILD layers 140 can include one or more layers of insulating carbon material with a low dielectric constant of less than about 2 (e.g., ranging from about 1 to about 1.9). In some embodiments, the one or more layers of insulating carbon material can include one or more fluorinated graphene layers with a dielectric constant ranging from about 1 to about 1.5, or can include one or more graphene oxide layers.

In some embodiments, metal line layers M1 through M6 can include electrically conductive metal lines 142-M1 through 142-M6, respectively. In some embodiments, via layers V1-V5 can include electrically conductive vias 144. Metal lines 142-M1 through 142-M6 and conductive vias 144 can be electrically connected to power supplies and/or active devices. The layout of metal lines 142-M1 through 142-M6 and conductive vias 144 is exemplary and not limiting and other layout variations of metal lines 142-M1 through 142-M6 and conductive vias 144 are within the scope of this disclosure. The number and arrangement of metal lines 142-M1 through 142-M6 and conductive vias 144 can be different from the ones shown in FIGS. 1A-1G. The routings (also referred to as "electrical connections") between device layer 114 and front-side interconnect structure 128 are exemplary and not limiting. There may be routings between device layer 114 and front-side interconnect structure 128 that are not visible in the cross-sectional and top-down views of FIGS. 1A-1G. In some embodiments, metal lines 142-M1 through 142-M6 and conductive vias 144 can include an electrically conductive material, such as copper (Cu), ruthenium (Ru), cobalt (Co), molybdenum (Mo), a Cu alloy (e.g., Cu—Ru, Cu—Al, or copper-manganese (CuMn)), and any other suitable conductive material. In some embodiments, thicknesses of metal lines 142-M1 through 142-M6 along a Z-axis can be substantially equal to or different from each other.

Referring to FIGS. 1A-1C, in some embodiments, front-side interconnect structure 128 can include a fault detection line 146A in metal line layer M4. FIGS. 1B-1C show different top-down views of a portion of front-side interconnect structure 128 with fault detection line 146A and metal lines 142-M4 through 142-M6 along line A-A of FIG. 1A, according to some embodiments. The cross-sectional view of FIG. 1A can be along line B-B of FIG. 1B or along line C-C of FIG. 1C, according to some embodiments. FIGS. 1B-1C do not show vias 144, ESLs 138, ILD layers 140, and metal lines 142-M1 through 142-M3 in metal line layers M1-M3 for simplicity.

In some embodiments, fault detection line 146A can include a conductive material similar to metal lines 142-M1 through 142-M6. In some embodiments, fault detection line 146A can be electrically connected to an output terminal (e.g., output terminal 105E shown in FIG. 1H) of a standard cell circuit (e.g., standard cell circuit 103 shown in FIG. 1H) to determine and monitor the operation status and/or manufacturing yield of the semiconductor devices in the standard cell circuit based on the signals from the output terminal. In some embodiments, multiple standard cell circuits in device layer 114 can be electrically connected in a chain connection (described above with reference to FIG. 1H) and fault detection line 146A can be electrically connected to an output terminal (e.g., output terminal 105E shown in FIG. 1H) of the chain connection to monitor the operation status and/or manufacturing yield of the semiconductor devices in the multiple standard cell circuits.

Fault detection line 146A can be electrically connected to the output terminal of the standard cell circuit through underlying metal lines (e.g., metal lines 142-M1 through 142-M3) and vias (e.g., vias 144 in via layers V1-V3). The electrical and/or optical signals emitted by fault detection line 146A represent the electrical and/or optical signals emitted by the output terminal of the standard cell circuit. In some embodiments, the electrical and/or optical signals can be detected by a fault detector 150 (shown in FIG. 1A) of a fault detection system (not shown) for determining and monitoring the operation status and/or manufacturing yield of the semiconductor devices in the standard cell circuit based on the detected signals. Based on the electrical and/or optical signals detected by fault detector 150, any malfunctioning semiconductor devices in the standard cell circuits in device layer 114 can be identified, and device failure analysis in device layer 114 can be performed by the fault detection system.

In some embodiments, fault detector 150 can be a camera equipped with an indium antimonide (InSb) detector for detecting microwave signals. In some embodiments, fault detector 150 can be infrared thermo-imaging cameras configured to detect infrared radiation. In some embodiments, fault detector 150 can include a laser voltage probe (LSP) and/or an emission microscope (EMMI) for detecting the electrical and/or optical signals and performing device failure analysis.

Fault detector 150 can be placed above IC chip package 100 and facing top-side surface 128t of interconnect structure 128 to capture and analyze the electrical and/or optical signals emitted by fault detection line 146A. In some embodiments, fault detector 150 can capture the electrical and/or optical signals that are emitted from a fault detection area 147A of fault detection line 146A, as shown in FIG. 1B, or from fault detection areas 147B-147C of fault detection line 146A, as shown in FIG. 1C. Fault detection areas 147A-147C can include top surface areas along an XY-plane of fault detection line 146A that are not shielded by or overlapped by any metal elements (e.g., metal lines and/or vias in front-side interconnect structure 128) of IC chip package 100 that are disposed above fault detection line 146A. In other words, the regions of IC chip package 100 that are disposed over and aligned with fault detection areas 147A-147C are metal-free regions. In some embodiments, IC chip package 100 can include a metal-free region 148A, as shown in FIG. 1A, aligned with fault detection area 147A or 147B. In some embodiments, IC chip package 100 can further include a metal-free region (not visible in cross-sectional view of FIG. 1A) aligned with fault detection area 147C.

The metal-free regions (e.g., metal-free region 148A) are formed over fault detection areas 147A-147C to allow the electrical and/or optical signals to be propagated from fault detection line 146A to fault detector 150. The electrical and/or optical signals can propagate through dielectric layers (e.g., ESLs 138, ILD layers 140) and semiconductor layers (e.g., substrate 130), but can be blocked by metal elements (e.g., metal lines and/or vias in front-side interconnect structure 128) if present in the signal propagation path between fault detection line 146A and fault detector 150. Due to such signal blockage by metal elements, fault detector 150 may not capture any electrical and/or optical signals emitted from portions of fault detection line 146A that are overlapped by metal lines 142-M5 and 142-M6, as shown in FIGS. 1A-1C.

Referring to FIGS. 1A-1C, in some embodiments, each of fault detection areas 147A-147C can have a surface area of at least about 20 nm by about 20 nm in an XY-plane. In some embodiments, each of fault detection areas 147A-147C can have a width X1 of at least about 20 nm along an X-axis. In some embodiments, fault detection areas 147A, 147B, and 147C can have a respective length Y1, Y2, and Y3 of at least about 20 nm along a Y-axis. In some embodiments, these dimensions of fault detection areas 147A-147C allow adequate detection of electrical and/or optical signals from fault detection line 146A by fault detector 150. If the surface area dimensions are below about 20 nm by about 20 nm, width X1 is below about 20 nm, and lengths Y1-Y3 are below about 20 nm, fault detector 150 may not adequately capture the electrical and/or optical signals from fault detection line 146A, resulting in inaccurate device failure analysis of the semiconductor devices in device layer 114 by the fault detection system.

In some embodiments, the surface areas of each of fault detection areas 147A-147C can range from about 20 nm by about 20 nm to about 100 µm by about 100 µm in an XY-plane or the upper limit can be based on layout design rules. In some embodiments, width X1 can range from about 20 nm to about 100 µm or the upper limit can be based on layout design rules, and lengths Y1, Y2, and Y3 can range from about 20 nm to about 100 µm or the upper limit can be based on layout design rules. In some embodiments, if the surface area dimensions are above 20 nm by about 20 nm, width X1 is above about 20 nm, and lengths Y1-Y3 are above about 20 nm, the volume area of the metal-free regions over fault detection areas 147A-147C increases, consequently increasing the size and manufacturing cost of IC chip package 100.

Referring to FIGS. 1A-1C, in some embodiments, fault detection line 146A can be spaced apart from adjacent metal lines metal lines 142-M4 in metal line layer M4 by distances X2 and X3 of at least about 20 nm along an X-axis and a distance Y4 of at least about 20 nm along a Y-axis to prevent fault detector 150 from capturing any electrical and/or optical signals from metal lines adjacent to fault detection line 146A. In some embodiments, distances X2, X3, and Y4 can range from about 20 nm to about 100 µm or the upper limit can be based on layout design rules. In some embodiments, if distances X2, X3, and Y4 are above about 20 nm, the size of front-side interconnect structure 128 increases, consequently increasing the size and manufacturing cost of IC chip package 100.

Though FIGS. 1A-1C show one fault detection line 146A in metal line layer M4, front-side interconnect structure 128 can have two or more fault detection lines in the same metal line layer or can have two or more non-overlapping fault detection lines in different metal line layers. For example, referring to FIGS. 1D-1G, front-side interconnect structure 128 can have fault detection lines 146B in metal line layer M5 and/or 146C in metal line layer M6 in addition to fault detection line 146A in metal line layer M4, or instead of fault detection line 146A in metal line layer M4. In some embodiments, cross-sectional views of FIGS. 1D and 1F can be at XZ-planes of IC chip 102 that are different from XZ-plane of FIG. 1A, or can be at different regions of the same XZ-plane as that of FIG. 1A. In some embodiments, front-side interconnect structure 128 can have fault detection lines 146A, 146B, and 146C and they can be non-overlapping with each other. In some embodiments, front-side interconnect structure 128 can have more than one fault detection lines 146A, 146B, and 146C in respective metal line layers M4, M5, and M6.

In some embodiments, fault detection lines can be disposed in the topmost three metal line layers of front-side interconnect structure 128, as illustrated by fault detection line 146A in metal line layer M4, fault detection line 146B in metal line layer M5, and fault detection line 146C in metal line layer M6. The fault detection lines can be placed in the topmost three metal line layers of front-side interconnect structure 128 for adequate signal detection by fault detector 150 and/or for minimizing the complexities of manufacturing front-side interconnect structure 128 with fault detection lines.

In some embodiments, for adequate signal detection by fault detector 150, fault detection line 146A can be placed in metal line layer M4 based on a criteria that a distance Y5 along a Z-axis between fault detection area 147A and top-side surface 128t is smaller than a distance Y6 along a Z-axis between fault detection area 147A and bottom-side surface 128b. In some embodiments, for adequate signal detection by fault detector 150, fault detection line 146A can be placed in metal line layer M4 based on a criteria that a ratio Y5:Y6 between distance Y5 and distance Y6 is about 1:2 to about 1:10.

Similarly, in some embodiments, for adequate signal detection by fault detector 150, fault detection line 146B can be placed in metal line layer M5 based on a criteria that a distance Y7 along a Z-axis between fault detection area 147D and top-side surface 128t is smaller than a distance Y8 along a Z-axis between fault detection area 147D and bottom-side surface 128b. In some embodiments, for adequate signal detection by fault detector 150, fault detection line 146B can be placed in metal line layer M4 based on a criteria that a ratio Y7:Y8 between distance Y7 and distance Y8 is about 1:2 to about 1:10.

Referring to FIGS. 1D-1E, in some embodiments, fault detection line 146B can include a conductive material similar to metal lines 142-M1 through 142-M6. FIG. 1E shows a top-down view of a portion of front-side interconnect structure 128 with fault detection line 146B and metal lines 142-M5 through 142-M6 along line D-D of FIG. 1D, according to some embodiments. The cross-sectional view of FIG. 1D can be along line E-E of FIG. 1E, according to some embodiments. FIG. 1E does not show vias 144, ESLs 138, ILD layers 140, and metal lines 142-M1 through 142-M4 in metal line layers M1-M4 for simplicity.

In some embodiments, fault detection line 146B can be electrically connected to an output terminal (e.g., output terminal 105E shown in FIG. 1H) of a standard cell circuit (e.g., standard cell circuit 103 shown in FIG. 1H) through underlying metal lines (e.g., metal lines 142-M1 through 142-M4) and vias (e.g., vias 144 in via layers V1-V3). In some embodiments, fault detection line 146B can be electrically connected to an output terminal (e.g., output terminal 105E shown in FIG. 1H) of multiple standard cell circuits in device layer 114 electrically connected in a chain connection.

Similar to fault detection line 146A, the electrical and/or optical signals are emitted from a fault detection area 147D of fault detection line 146B, as shown in FIG. 1E, and are detected by fault detector 150. Fault detection area 147D can include a top surface area along an XY-plane of fault detection line 146B that is not shielded by or overlapped by any metal elements (e.g., metal lines and/or vias in front-side interconnect structure 128) of IC chip package 100 that are disposed above fault detection line 146B. In other words, the region of IC chip package 100 that is disposed over and aligned with fault detection area 147D is a metal-free region. In some embodiments, IC chip package 100 can include a metal-free region 148B, as shown in FIG. 1D, aligned with fault detection area 147D. Similar to fault detection line 146A, metal-free region 148B is formed over fault detection area 147D to allow the electrical and/or optical signals to be propagated from fault detection line 146B to fault detector 150. Due to signal blockage by metal elements, fault detector 150 may not capture any electrical and/or optical signals emitted from portions of fault detection line 146B that are overlapped by metal lines 142-M6, as shown in FIGS. 1D-1E.

In some embodiments, fault detection area 147D can have a surface area of at least about 20 nm by about 20 nm in an XY-plane, widths X4-X5 of at least about 20 nm along an X-axis, and a length Y9 of at least about 20 nm along a Y-axis. In some embodiments, these dimensions of fault detection area 147D allow adequate detection of electrical and/or optical signals from fault detection line 146B by fault detector 150. Below these dimensions of surface area, widths X4-X5, and length Y9, fault detector 150 may not adequately capture the electrical and/or optical signals from fault detection line 146B, resulting in inaccurate device failure analysis of the semiconductor devices in device layer 114 by the fault detection system. In some embodiments, fault detection area 147D can have dimension ranges for the surface area, widths X4-X5, and length Y9 similar to the dimension ranges for the surface area, width X1, and length Y1 of fault detection area 147A.

In some embodiments, fault detection line 146B can be spaced apart from adjacent metal lines 142-M5 in metal line layer M5 by distances X6 and X7 of at least about 20 nm along an X-axis, and distances Y10 and Y11 of at least about 20 nm along a Y-axis to prevent fault detector 150 from capturing any electrical and/or optical signals from metal lines adjacent to fault detection line 146B. In some embodiments, fault detection area 147D can have dimension ranges for distances X6, X7, Y10, and Y11 similar to the dimension ranges for distances X2, X3, and Y4 of fault detection area 147A.

Referring to FIGS. 1F-1G, in some embodiments, fault detection line 146C can include a conductive material similar to metal lines 142-M1 through 142-M6. FIG. 1G shows a top-down view of a portion of front-side interconnect structure 128 with fault detection line 146C and metal lines 142-M6 along line F-F of FIG. 1F, according to some embodiments. The cross-sectional view of FIG. 1F can be along line G-G of FIG. 1G, according to some embodiments. FIG. 1G does not show vias 144, ESLs 138, ILD layers 140, and metal lines 142-M1 through 142-M5 in metal line layers M1-M5 for simplicity.

In some embodiments, fault detection line 146C can be electrically connected to an output terminal (e.g., output terminal 105E shown in FIG. 1H) of a standard cell circuit (e.g., standard cell circuit 103 shown in FIG. 1H) through underlying metal lines (e.g., metal lines 142-M1 through 142-M5) and vias (e.g., vias 144 in via layers V1-V3). In some embodiments, fault detection line 146C can be electrically connected to an output terminal (e.g., output terminal 105E shown in FIG. 1H) of multiple standard cell circuits in device layer 114 electrically connected in a chain connection.

Similar to fault detection line 146A, the electrical and/or optical signals are emitted from a fault detection area 147E of fault detection line 146C, as shown in FIG. 1G, and are detected by fault detector 150. Fault detection area 147E can include a top surface area along an XY-plane of fault detection line 146C that is not shielded by or overlapped by any metal elements of IC chip package 100 that are disposed above fault detection line 146C. In other words, the region of IC chip package 100 that is disposed over and aligned with fault detection area 147E is a metal-free region. In some embodiments, IC chip package 100 can include a metal-free region 148C, as shown in FIG. 1E, aligned with fault detection area 147E. Similar to fault detection line 146A, metal-free region 148C is formed over fault detection area 147E to allow the electrical and/or optical signals to be propagated from fault detection line 146C to fault detector 150.

In some embodiments, fault detection area 147E can have a surface area of at least about 20 nm by about 20 nm in an XY-plane, a width X8 of at least about 20 nm along an X-axis, and a length Y12 of at least about 20 nm along a Y-axis. In some embodiments, these dimensions of fault detection area 147E allow adequate detection of electrical and/or optical signals from fault detection line 146C by fault detector 150. Below these dimensions of surface area, width X8, and length Y12, fault detector 150 may not adequately capture the electrical and/or optical signals from fault detection line 146B, resulting in inaccurate device failure analysis of the semiconductor devices in device layer 114 by the fault detection system. In some embodiments, fault detection area 147E can have dimension ranges for the surface area, width X8, and length Y12 similar to the dimension ranges for the surface area, width X1, and length Y1 of fault detection area 147A.

In some embodiments, fault detection line 146C can be spaced apart from adjacent metal lines 142-M6 in metal line layer M6 by distances X9 and X10 of at least about 20 nm along an X-axis and distances Y13 and Y14 of at least about 20 nm along a Y-axis to prevent fault detector 150 from capturing any electrical and/or optical signals from metal lines adjacent to fault detection line 146C. In some embodiments, fault detection area 147E can have dimension ranges for distances X9, X10, Y13, and Y14 similar to the dimension ranges for distances X2, X3, and Y4 of fault detection area 147A.

Figure 9:
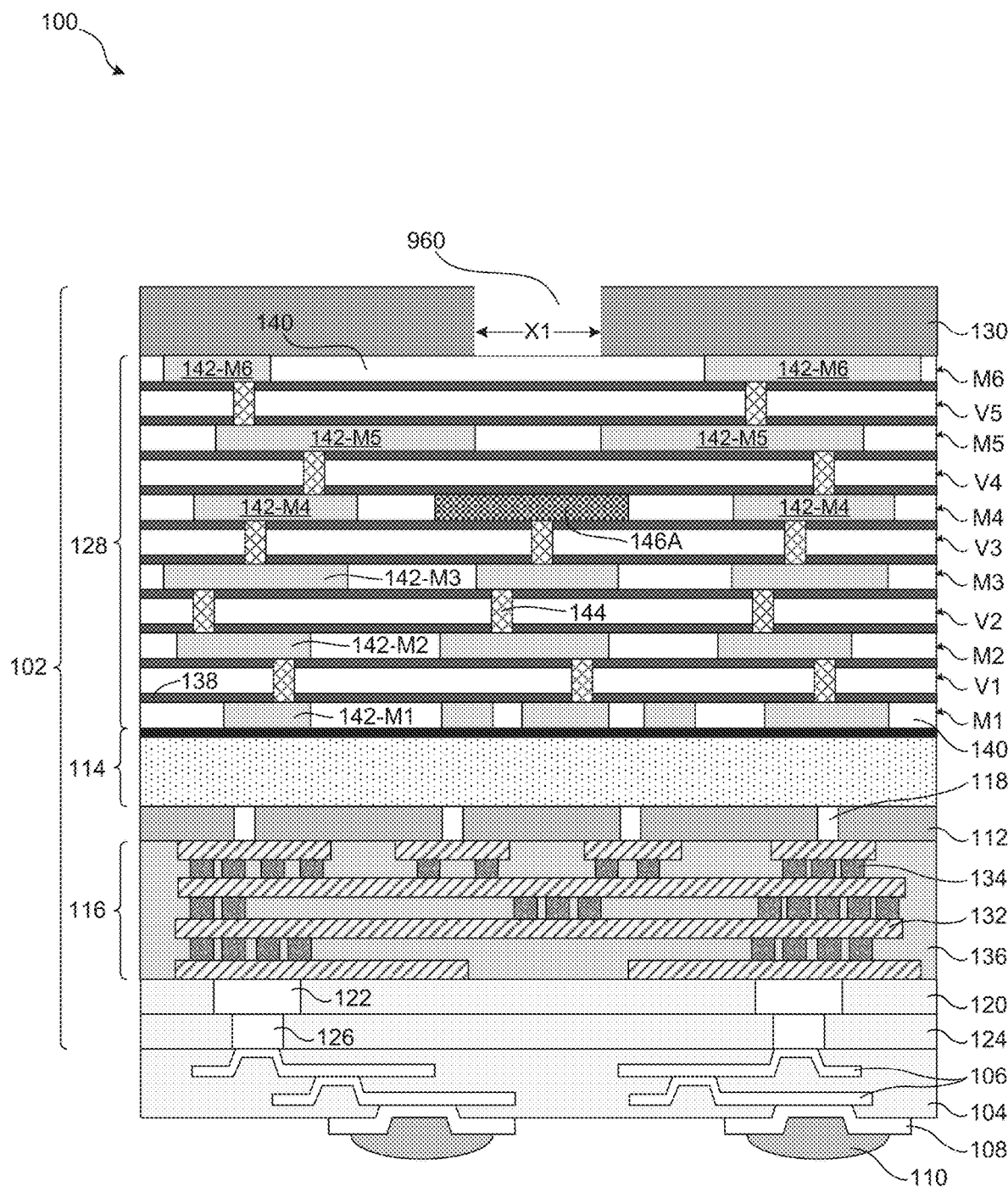

In some embodiments, the portions of metal-free regions 148A-148C in substrate 130 can be an opening 960, as shown in FIG. 9.

In some embodiments, fault detection lines 146A-146C are used for fault detection and device failure analysis, and may not be used for routing electrical signals between the devices in device layer 114 and/or between power supplies and the devices in device layer 114. The electrical and/or optical signals emitted by fault detection line 146A-146C are indicative of the presence or the absence of defects in the devices in device layer 114. In some embodiments, fault detection lines 146A-146C can be electrically connected to first, second, and third output terminals of first, second, third standard cell circuits, respectively. The first, second, and third standard cell circuits can be at different regions of device layer 114.

FIG. 2A illustrates an isometric view of a FET 252 in device layer 114 and metal line layer M1 of front-side interconnect structure 128 in region 101 of FIGS. 1A, 1D, and 1F, according to some embodiments. FIGS. 2B-2C illustrate different cross-sectional views along line J-J of FIG. 2A with additional structures that are not shown in FIG.

2A for simplicity, according to some embodiments. The discussion of elements in FIGS. 1A-1H and 2A-2C with the same annotations applies to each other, unless mentioned otherwise. The elements of front-side interconnect structure 128 are not shown in FIG. 2A for simplicity. In some embodiments, FET 252 can represent n-type FET 252 (NFET 252) or p-type FET 252 (PFET 252) and the discussion of FET 252 applies to both NFET 252 and PFET 252, unless mentioned otherwise. In some embodiments, FET 252 can be formed on substrate 112 and can include an array of gate structures 212 disposed on a fin structure 206 and an array of S/D regions 210A-210C (S/D region 210A visible in FIG. 2A; 210A-210C visible in FIGS. 2B-2C) disposed on portions of fin structure 206 that are not covered by gate structures 212. In some embodiments, fin structure 206 can include a material similar to substrate 112 and extend along an X-axis. In some embodiments, FET 252 can further include gate spacers 214, STI regions 216, ESLs 217A-217C, and ILD layers 218A-218C. In some embodiments, gate spacers 214, STI regions 216, ESLs 217A, and ILD layers 218A-218B can include an insulating material, such as silicon oxide, silicon nitride (SiN), silicon carbon nitride (SiCN), silicon oxycarbon nitride (SiOCN), and silicon germanium oxide.

Referring to FIG. 2B, in some embodiments, FET 252 can be a GAA FET 252 and can include (i) S/D regions 210A-210C, (ii) contact structures 230 disposed on front-side surface of S/D regions 210A-210C, (iii) via structures 236 disposed on contact structures 230, (iv) nanostructured channel regions 220 disposed on fin structure 206, (v) gate structures 212 surrounding nanostructured channel regions 220, and (vi) conductive through-vias 118 disposed on back-side surface of S/D regions 210A and 210C. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, or about 10 nm; other values less than about 100 nm are within the scope of the disclosure. In some embodiments, FET 252 can be a finFET 252, as shown in FIG. 2C.

In some embodiments, nanostructured channel regions 220 can include semiconductor materials similar to or different from substrate 112. In some embodiments, nanostructured channel regions 220 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 220 are shown, nanostructured channel regions 220 can have cross-sections with other geometric shapes (e.g., circular, elliptical, triangular, or polygonal). Gate portions of gate structures 212 surrounding nanostructured channel regions 220 can be electrically isolated from adjacent S/D regions 210A-210C by inner spacers 213. Inner spacers 213 can include an insulating material, such as $SiO_x$, SiN, SiCN, SiOCN, and other suitable insulating materials.

Each of gate structures 212 can include (i) an interfacial oxide (IO) layer 222, (ii) a high-k (HK) gate dielectric layer 224 disposed on IO layer 222, (iii) a work function metal (WFM) layer 226 disposed on HK gate dielectric layer 224, and (iv) a gate metal fill layer 228 disposed on WFM layer 226. IO layers 222 can include silicon oxide ($SiO_2$), silicon germanium oxide ($SiGeO_x$), germanium oxide ($GeO_x$), or other suitable oxide materials. HK gate dielectric layers 224 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), and other suitable high-k dielectric materials.

For NFET 252, WFM layer 226 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For PFET 252, WFM layer 226 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), other suitable substantially Al-free conductive materials, or a combination thereof. Gate metal fill layers 228 can include a conductive material, such as tungsten (W), Ti, silver (Ag), ruthenium (Ru), molybdenum (Mo), copper (Cu), cobalt (Co), Al, iridium (Ir), nickel (Ni), metal alloys, other suitable conductive materials, and a combination thereof.

For NFET 252, each of S/D regions 210A-210C can include an epitaxially-grown semiconductor material, such as Si, and n-type dopants, such as phosphorus and other suitable n-type dopants. For PFET 252, each of S/D regions 210A-210C can include an epitaxially-grown semiconductor material, such as Si and SiGe, and p-type dopants, such as boron and other suitable p-type dopants. In some embodiments, each of contact structures 230 can include (i) a silicide layer 232 disposed within each of S/D regions 210A-210C and (ii) a contact plug 234 disposed on silicide layer 232. In some embodiments, silicide layers 232 can include a metal silicide. In some embodiments, contact plugs 234 can include a conductive material, such as cobalt (Co), tungsten (W), ruthenium (Ru), iridium (Ir), nickel (Ni), osmium (Os), rhodium (Rh), aluminum (Al), molybdenum (Mo), other suitable conductive materials, and a combination thereof. In some embodiments, via structures 236 and conductive through-vias 118 can include conductive materials, such as Ru, Co, Ni, Al, Mo, W, Ir, Os, Cu, and Pt. Contact structures 230 can electrically connect to overlying metal lines 142-M1 through via structures 236. In some embodiments, S/D regions 210A-210C can electrically connect to back-side interconnect structure 116 through conductive through-vias 118.

Figure 3:
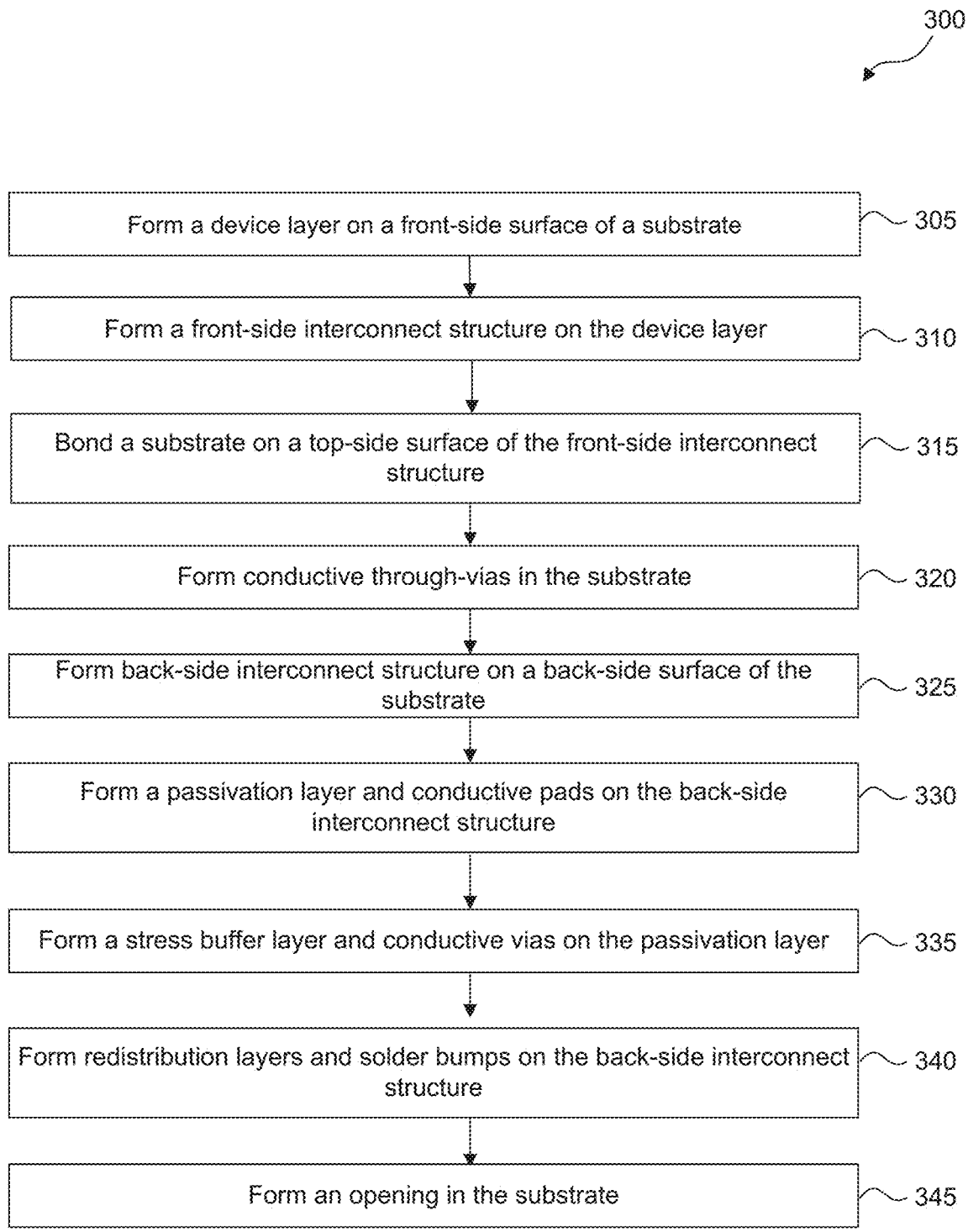
FIG. 3 is a flow diagram of a method for fabricating an IC chip package with a fault detection line, in accordance with some embodiments.

FIG. 3 is a flow diagram of an example method 300 for fabricating IC chip package 100 with cross-sectional view shown in FIG. 1A, according to some embodiments. For illustrative purposes, the operations illustrated in FIG. 3 will be described with reference to the example fabrication process for fabricating IC chip package 100 as illustrated in FIGS. 4-9. FIGS. 4-9 are cross-sectional views of IC chip package 100 at various stages of fabrication, according to some embodiments. Operations can be performed in a different order or not performed depending on specific applications. It should be noted that method 300 may not produce a complete IC chip package 100. Accordingly, it is understood that additional processes can be provided before, during, and after method 300, and that some other processes may only be briefly described herein. Elements in FIGS. 4-9 with the same annotations as elements in FIGS. 1A-1H and 2A-2C are described above.

Figure 4:
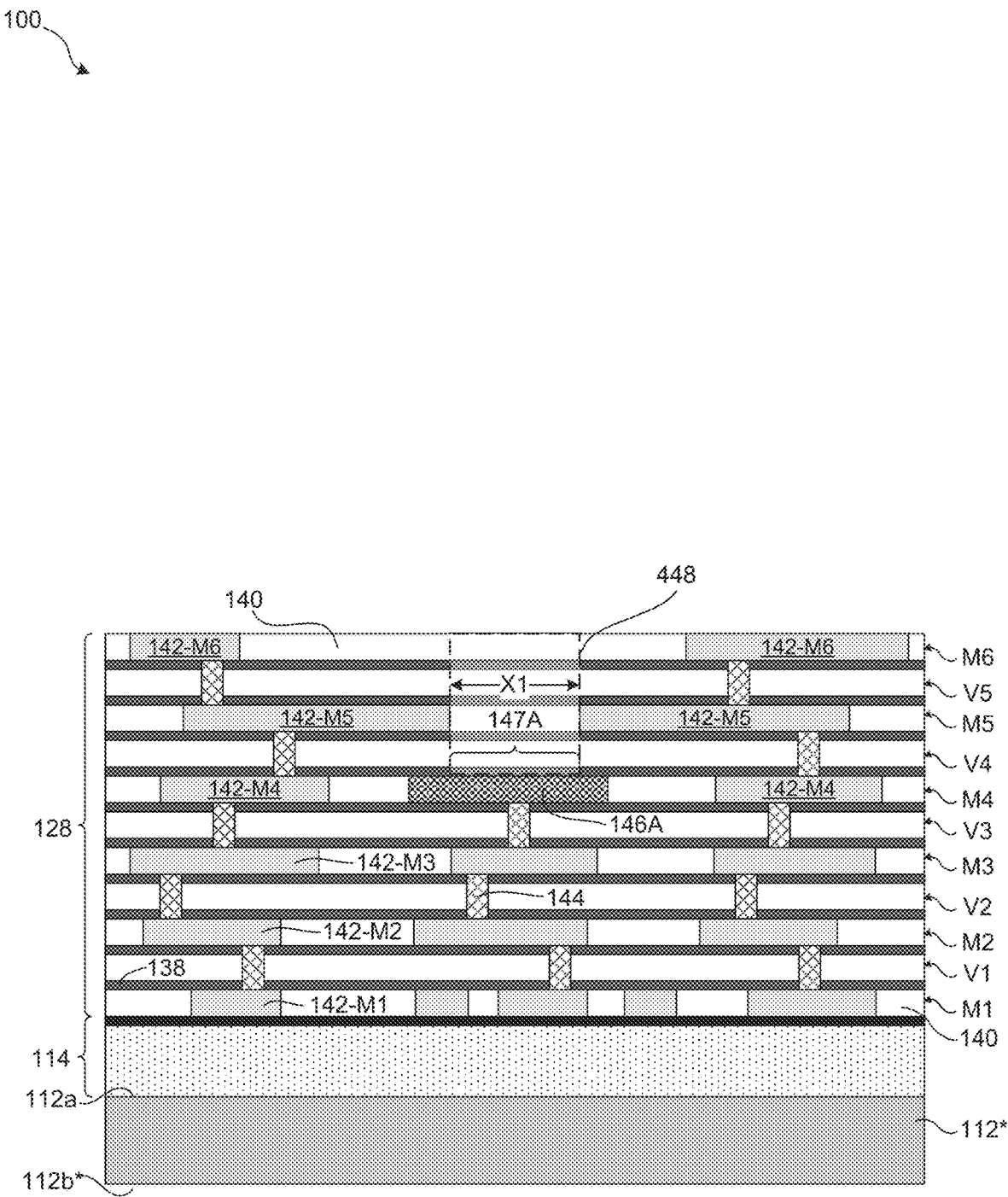
FIGS. 4-9 illustrate cross-sectional views of an IC chip package at various stages of its fabrication process, in accordance with some embodiments.

Referring to FIG. 3, in operation 305, a device layer is formed on a front-side surface of a substrate. For example, as shown in FIG. 4, device layer 114 is formed on front-side surface 112a of substrate 112*. In some embodiments, semiconductor devices, such as GAA FETs, finFETs, and MOSFETs, can be formed in device layer 114.

Referring to FIG. 3, in operation 310, a front-side interconnect structure is formed on the device layer. For example, as shown in FIG. 4, front-side interconnect structure 128 is formed on device layer 114. The formation of front-side interconnect structure 128 can include forming fault detection line 146A with fault detection surface area 147A having width X1 and length Y1, as described above with reference to FIGS. 1A-1B, or with fault detection surface areas 147B-147C (not shown in FIG. 4) having width X1 and lengths Y2-Y3, as described above with reference to FIGS. 1A and 1C. The formation of front-side interconnect structure 128 can further include forming a metal-free region 448 aligned with fault detection surface area 147A or 147B. Metal-free region 448 can be the portion of metal-free region 148A in front-side interconnect structure 128 described above with reference to FIGS. 1A-1C.

In some embodiments, the formation of fault detection line 146A can include using an automatic placement and routing (APR) tool to scan the standard cell circuit layouts in device layer 114 and identify the output terminal (e.g., output terminal 105E) of the standard cell circuit (e.g., standard cell circuit 103) to which fault detection line 146A is to be electrically connected. In some embodiments, the formation of metal-free region 448 can include determining, using the APR tool, the regions of front-side interconnect structure 128 in which metal lines and vias may not be formed.

Figure 5:
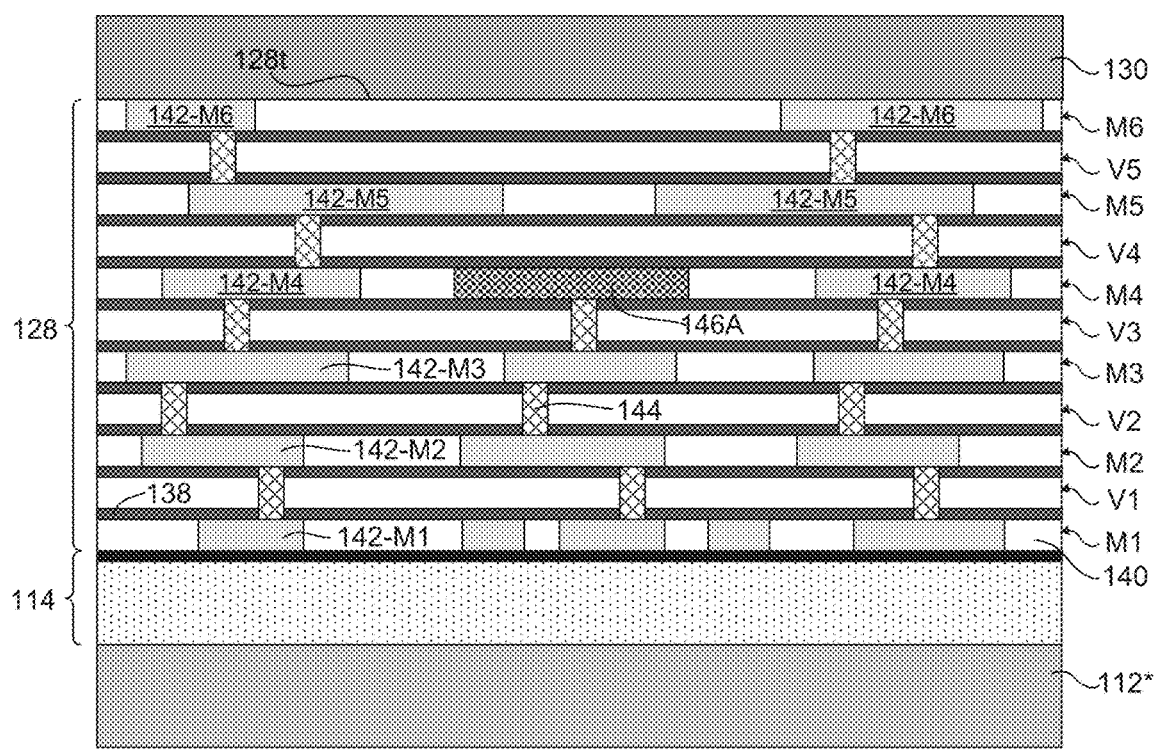
Figure 5:
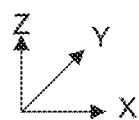

Referring to FIG. 3, in operation 315, a substrate is bonded to a top-side surface of the front-side interconnect structure. For example, as shown in FIG. 5, substrate 130 is bonded to top-side surface 128t of front-side interconnect structure 128. In some embodiments, a wafer thinning process can be performed on substrate 130.

Figure 6:
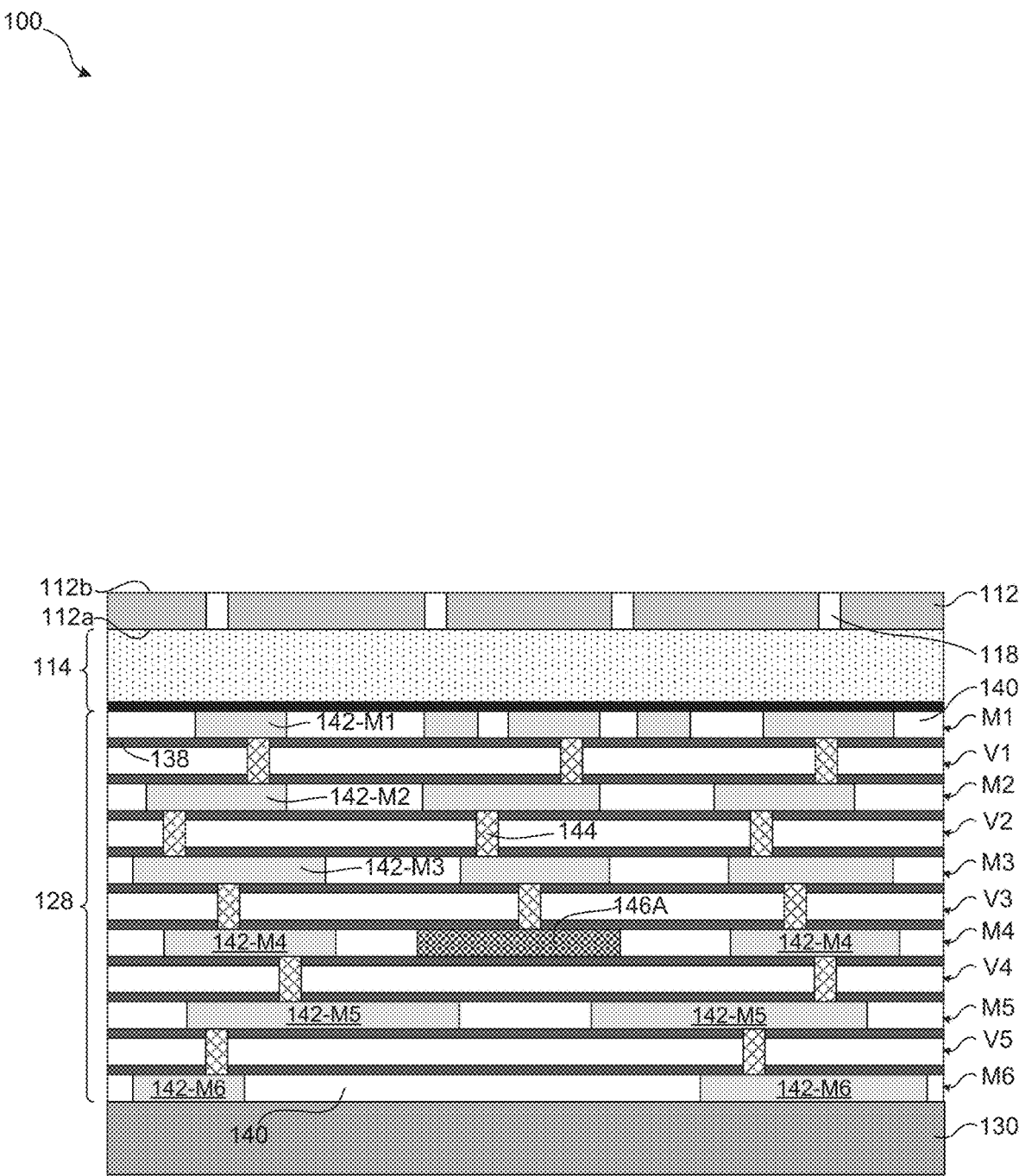

Referring to FIG. 3, in operation 320, conductive through-vias are formed in the substrate. For example, as shown in FIG. 6, conductive through-vias 118 are formed in substrate 112. In some embodiments, a wafer thinning process can be performed on substrate 112* to form substrate 112 prior to the formation of conductive through-vias 118.

Figure 7:
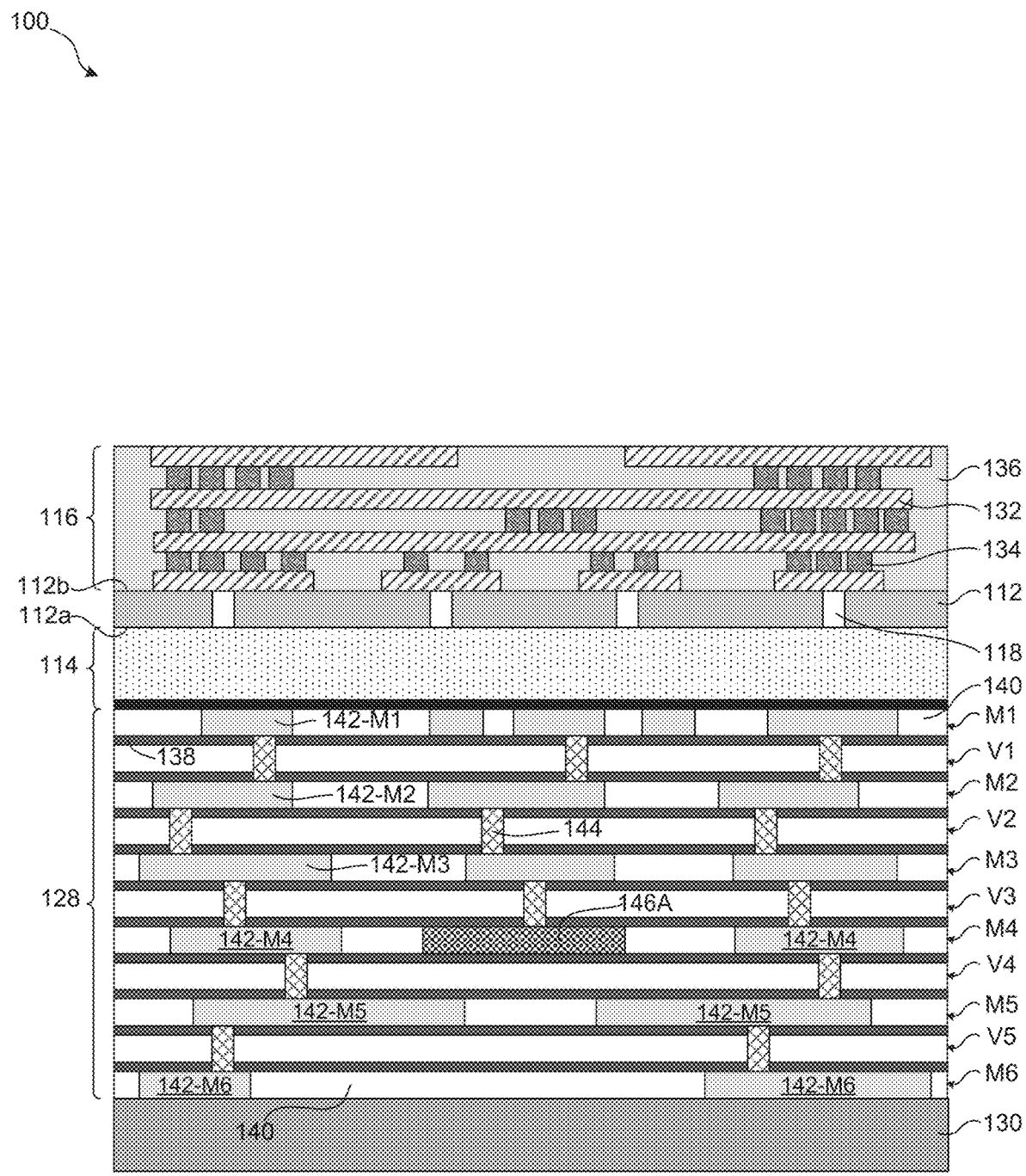

Referring to FIG. 3, in operation 325, a back-side interconnect structure is formed on a back-side surface of the substrate. For example, as shown in FIG. 7, back-side interconnect structure 116 is formed on back-side surface 112b of substrate 112.

Figure 8:
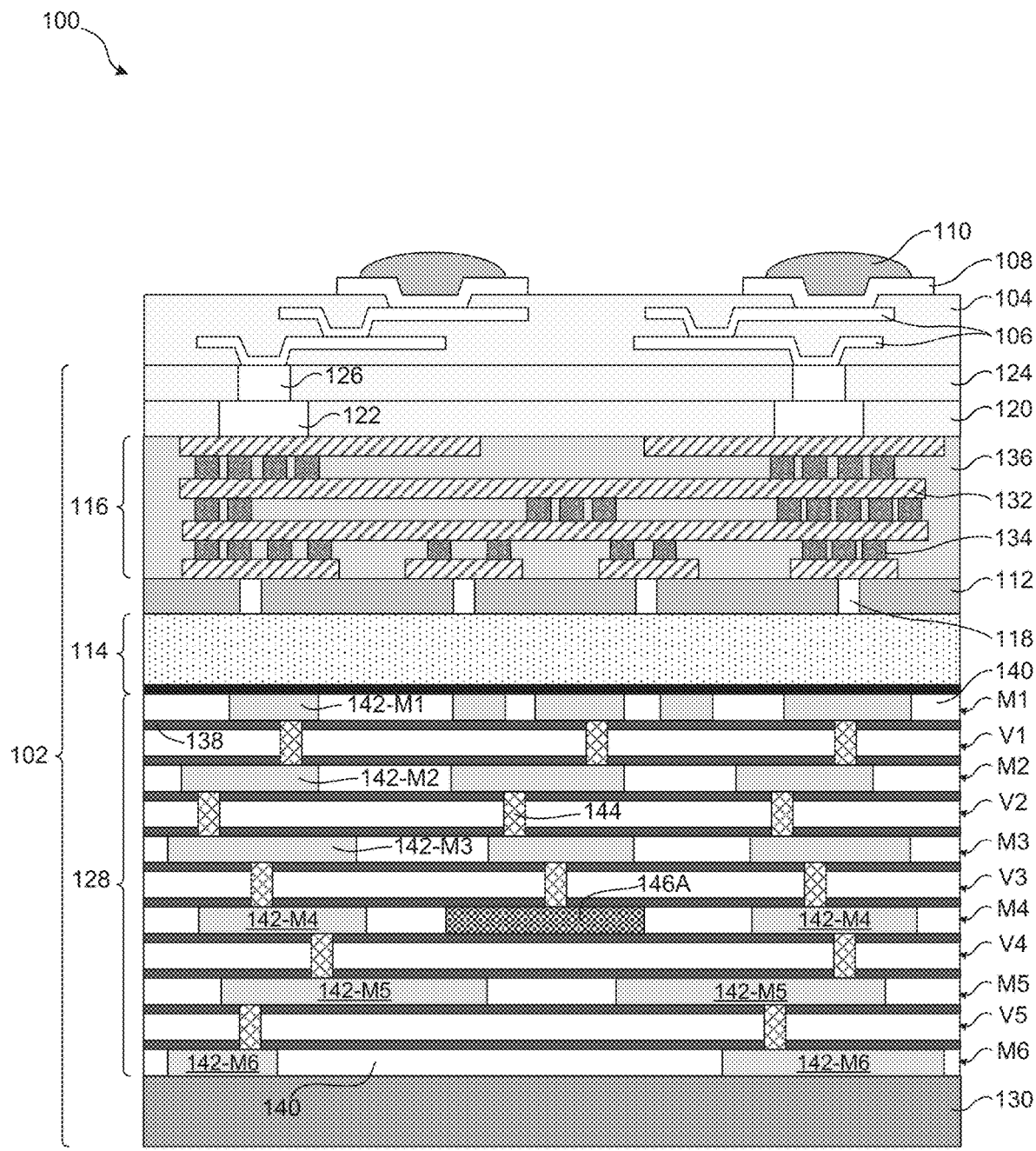

Referring to FIG. 3, in operation 330, a passivation layer and conductive pads are formed on the back-side interconnect structure. For example, as shown in FIG. 8, passivation layer 120 and conductive pads 122 are formed on back-side interconnect structure 116. In some embodiments, the formation of passivation layer 120 can include depositing an oxide layer on back-side interconnect structure 116 and depositing a nitride layer on the oxide layer. In some embodiments, the formation of conductive pads 122 can include sequential operations of: (i) forming openings (not shown) in passivation layer 120 with a lithographic process and an etching process, (ii) depositing a metal layer (not shown) in the openings, and (iii) selectively removing portions of the metal layer with a lithographic process and an etching process.

Referring to FIG. 3, in operation 335, a stress buffer layer and conductive vias are formed on the passivation layer. For example, as shown in FIG. 8, stress buffer layer 124 and conductive vias 126 are formed on passivation layer 120. In some embodiments, the formation of conductive vias 126 can include depositing a metal layer (not shown) on passi- vation layer 120 and conductive pads 122, and selectively removing portions of the metal layer with a lithographic process and an etching process. In some embodiments, the formation of stress buffer layers 124 can include depositing a polymer layer (not shown) on passivation layer 120 and conductive vias 126, and performing a curing process on the polymer layer. In some embodiments, the curing process can be performed at a temperature of about 250° C. to about 400° C. for a duration of about 1 hour to about 4 hours.

Referring to FIG. 3, in operation 340, redistribution layers are formed on the stress buffer layer and conductive vias. For example, as shown in FIG. 8, redistribution layers 106 are formed on stress buffer layer 124 and conductive vias 126. In some embodiments, contact pads 108 and solder balls 110 can be formed after the formation of redistribution layers 106.

Referring to FIG. 3, in operation 345, an opening is formed in the substrate. For example, as shown in FIG. 9, an opening 960 is formed in substrate 130. In some embodiments, operation 345 may not be performed.

The present disclosure provides example structures of IC chips (e.g., IC chip 102) with fault detection lines (e.g., fault detection lines 146A-146C) in front-side interconnect structures (e.g., front-side interconnect structure 128) of the IC chips and example methods (e.g., method 300) of fabricating the same to reduce the volume area of metal-free regions (e.g., metal-free regions 148A-148C) in the front-side interconnect structures. In some embodiments, the fault detection lines can be metal lines in the front-side interconnect structure and electrically connected to the terminals (e.g., output terminal 105E) of the semiconductor devices (e.g., GAA FETs, finFETs, or MOSFETs) in the IC chip through other metal lines and vias in the front-side interconnect structure. The signals emitted by the fault detection lines represent the signals emitted by the terminals of the semiconductor devices and are detected by a fault detector (e.g., fault detector 150) of a fault detection system for monitoring faults in the semiconductor devices. By extending the points of fault detection from the terminals of the semiconductor devices in the device layer (e.g., device layer 114) to the fault detection lines in the front-side interconnect structure on the device layer, the signal propagation path through the IC chip to the fault detector is reduced. As a result of the short signal propagation path the front-side interconnect structure, the volume area for metal-free regions in the front-side interconnect structure can be reduced.

In some embodiments, a structure includes a substrate with first and second surfaces, a device layer disposed on the first surface of the substrate, a first interconnect structure disposed on the device layer, and a second interconnect structure disposed on the second surface of the substrate. The first interconnect structure includes a fault detection line disposed in a first metal line layer and configured to emit an electrical or an optical signal that is indicative of a presence or an absence of a defect in the device layer, a metal-free region disposed on the fault detection line, and a metal line disposed adjacent to the fault detection line in the first metal line layer. A first distance between the fault detection line and a top surface of the first interconnect structure is smaller than a second distance between the fault detection line and a bottom surface of the first interconnect structure. The fault detection line is electrically connected to the device layer.

In some embodiments, a structure includes a first substrate with first and second surfaces, a device layer disposed on the first surface of the first substrate, a first interconnect structure disposed on the device layer, a second substrate disposed on the first interconnect structure, and a second interconnect structure disposed on the second surface of the first substrate. The first interconnect structure includes a first fault detection line disposed in a first metal line layer and configured to emit an electrical or an optical signal that is indicative of a presence or an absence of a defect in a first region of the device layer, a second fault detection line disposed in a second metal line layer and configured to emit an electrical or an optical signal that is indicative of a presence or an absence of a defect in a second region of the device layer, and first and second metal-free regions disposed on the first and second fault detection lines, respectively. The first and second fault detection lines are non-overlapping with each other.

In some embodiments, a method includes forming a device layer on a first substrate, forming a first interconnect structure on the device layer, bonding a second substrate on the top surface of the first interconnect structure, forming a conductive through-via in the first substrate, and forming a second interconnect structure on the second surface of the first substrate. The forming the first interconnect structure includes forming a stack of metal line layers with metal lines on the device layer, forming a fault detection line on the stack of metal line layers to emit an electrical or an optical signal that is indicative of a presence or an absence of a defect in the device layer, and forming a metal-free region on the fault detection line. A first distance between the fault detection line and a top surface of the first interconnect structure is smaller than a second distance between the fault detection line and a bottom surface of the first interconnect structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a substrate with first and second surfaces;
a device layer disposed on the first surface of the substrate;
a first interconnect structure disposed on the device layer, comprising:
a fault detection line disposed in a first metal line layer and configured to emit an electrical or an optical signal that is indicative of a presence or an absence of a defect in the device layer, wherein the fault detection line is electrically connected to the device layer;
a metal-free region disposed on the fault detection line; and
a metal line disposed adjacent to the fault detection line in the first metal line layer; and
a second interconnect structure disposed on the second surface of the substrate.

2. The structure of claim 1, wherein the fault detection line comprises a fault detection area aligned with the metal-free region.

3. The structure of claim 1, wherein the first interconnect structure comprises a second metal line disposed in a second metal line layer over the first metal line layer, and
wherein the fault detection line comprises a first surface area aligned with the metal-free region and a second surface area overlapping with the second metal line.

4. The structure of claim 1, wherein the fault detection line comprises a fault detection area with a surface area of at least about 20 nm by about 20 nm.

5. The structure of claim 1, wherein the fault detection line is spaced apart from the metal line by a distance of at least about 20 nm.

6. The structure of claim 1, wherein the device layer comprises a transistor with a source/drain region and a contact structure disposed on the source/drain region, and
wherein the fault detection line is electrically connected to the contact structure.

7. The structure of claim 1, wherein the first interconnect structure further comprises a stack of metal line layers disposed between the fault detection line and the device layer, and
wherein the fault detection line is electrically connected to the device layer through a plurality of metal lines disposed in the stack of metal line layers.

8. The structure of claim 1, wherein the fault detection line comprises a metal.

9. The structure of claim 1, further comprising a conductive through-via disposed in the substrate, and
wherein the device layer is electrically connected to the second interconnect structure through the conductive through-via.

10. The structure of claim 1, wherein a first distance between the fault detection line and a top surface of the first interconnect structure is smaller than a second distance between the fault detection line and a bottom surface of the first interconnect structure.

11. A structure, comprising:
a first substrate with first and second surfaces;
a device layer disposed on the first surface of the first substrate;
a first interconnect structure disposed on the device layer, comprising:
a first fault detection line disposed in a first metal line layer and configured to emit an electrical or an optical signal that is indicative of a presence or an absence of a defect in a first region of the device layer;
a second fault detection line disposed in a second metal line layer and configured to emit an electrical or an optical signal that is indicative of a presence or an absence of a defect in a second region of the device layer, wherein the first and second fault detection lines are non-overlapping with each other; and
first and second metal-free regions disposed on the first and second fault detection lines, respectively;
a second substrate disposed on the first interconnect structure; and
a second interconnect structure disposed on the second surface of the first substrate.

12. The structure of claim 11, wherein the first and second metal line layers are separated by a via layer comprising a metal via.

13. The structure of claim 11, wherein each of the first and second fault detection lines comprises a fault detection area with a surface area of at least about 20 nm by about 20 nm.

14. The structure of claim 11, wherein the first metal line layer is a topmost metal line layer of the first interconnect structure.

15. The structure of claim 11, wherein the first metal line layer is one of three topmost metal line layers of the first interconnect structure.

16. The structure of claim 11, wherein a first distance between the first fault detection line and a top surface of the first interconnect structure is smaller than a second distance between the first fault detection line and a bottom surface of the first interconnect structure.

17. A structure, comprising:
- a substrate;
- a device layer disposed on the substrate;
- an interconnect structure, comprising:
  - metal lines disposed on the device layer;
  - a fault detection line, disposed on the metal lines, configured to emit an electrical or an optical signal that is indicative of a presence or an absence of a defect in the device layer, wherein a first distance between the fault detection line and a top surface of the interconnect structure is smaller than a second distance between the fault detection line and a bottom surface of the interconnect structure; and
  - a metal-free region disposed on the fault detection line; and
- a conductive through-via disposed in the substrate.

18. The structure of claim 17, wherein the fault detection line comprises a metal layer with a surface area of at least about 20 nm by about 20 nm.

19. The structure of claim 17, wherein the fault detection line comprises a metal layer spaced apart from adjacent metal layers by a distance of at least about 20 nm.

20. The structure of claim 17, wherein the device layer comprises a gate-all-around transistor.

* * * * *